(12) United States Patent
Kataoka et al.

(10) Patent No.: US 8,169,215 B2
(45) Date of Patent: May 1, 2012

(54) MAGNETIC SENSOR AND METHOD OF MANUFACTURING THEREOF

(75) Inventors: Makoto Kataoka, Tokyo (JP); Katsumi Kakuta, Tokyo (JP); Yo Yamagata, Tokyo (JP); Yuichi Kanayama, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 614 days.

(21) Appl. No.: 12/296,770

(22) PCT Filed: Mar. 28, 2007

(86) PCT No.: PCT/JP2007/056710
§ 371 (c)(1),
(2), (4) Date: May 13, 2009

(87) PCT Pub. No.: WO2007/119569
PCT Pub. Date: Oct. 25, 2007

(65) Prior Publication Data
US 2009/0309590 A1      Dec. 17, 2009

(30) Foreign Application Priority Data

Apr. 13, 2006   (JP) ................. 2006-111100

(51) Int. Cl.
*G01R 33/06* (2006.01)
(52) U.S. Cl. ....................................................... 324/251
(58) Field of Classification Search .................. None
See application file for complete search history.

(56) References Cited

U.S. PATENT DOCUMENTS

| | | | | | |
|---|---|---|---|---|---|
| 4,123,772 | A | * | 10/1978 | Janssen ........................ | 257/427 |
| 4,829,352 | A | * | 5/1989 | Popovic et al. ............... | 257/426 |
| 4,908,685 | A | * | 3/1990 | Shibasaki et al. ............. | 257/425 |

(Continued)

FOREIGN PATENT DOCUMENTS

JP    49-135587    12/1974

(Continued)

OTHER PUBLICATIONS

Official Action from Japanese Patent Office in corresponding Japanese Patent Application No. 2006-328280, mailed Feb. 4, 2011, 12 pages.

(Continued)

*Primary Examiner* — Paresh Patel
(74) *Attorney, Agent, or Firm* — Finnegan, Henderson, Farabow, Garrett & Dunner, L.L.P.

(57) ABSTRACT

The present invention relates to a magnetic sensor with which magnetic characteristics are made extremely stable by consideration of an area of contact of a base layer of a magnetic substance and a semiconductor substrate. On a semiconductor substrate (111) a plurality of Hall elements (112a, 112b) are embedded so as to be coplanar to a top surface of the semiconductor substrate while being mutually spaced apart by a predetermined distance, and above the Hall elements and the semiconductor substrate, a base layer (114), having coefficient of thermal expansion differing from that of the Hall elements and partially covers a region of each Hall elements, is formed via a protective layer (113), and a magnetic flux concentrator (115), having an area larger than the base layer and with magnetic amplification, is formed on the base layer. An area of contact of the base layer of the magnetic substance and the semiconductor substrate is made small to lessen the generation of an offset voltage.

36 Claims, 33 Drawing Sheets

U.S. PATENT DOCUMENTS

| | | |
|---|---|---|
| 5,883,567 A | 3/1999 | Mullins, Jr. |
| 2002/0011841 A1 | 1/2002 | Goto et al. |
| 2002/0021124 A1 | 2/2002 | Schott et al. |

FOREIGN PATENT DOCUMENTS

| | | |
|---|---|---|
| JP | 60-208882 | 10/1985 |
| JP | 62-142862 | 9/1987 |
| JP | 01-169955 | 7/1989 |
| JP | 04-113684 | 4/1992 |
| JP | 7-58173 | 3/1995 |
| JP | 08-097486 | 4/1996 |
| JP | 09-129944 | 5/1997 |
| JP | 11-242073 | 9/1999 |
| JP | 11-261131 | 9/1999 |
| JP | 2000-228003 | 8/2000 |
| JP | 2000-340856 | 12/2000 |
| JP | 2000-349363 | 12/2000 |
| JP | 2001-014616 | 1/2001 |
| JP | 2001-281312 | 10/2001 |
| JP | 2002-071381 | 3/2002 |
| JP | 2002-252394 | 9/2002 |
| JP | 2002-286765 | 10/2002 |
| JP | 2002-343639 | 11/2002 |
| JP | 2003-142752 | 5/2003 |
| JP | 2003-142762 | 5/2003 |
| JP | 2003-294818 | 10/2003 |
| JP | 2004-061380 | 2/2004 |
| JP | 2004-158668 | 6/2004 |
| JP | 2004-257995 | 9/2004 |
| JP | 2005-019566 | 1/2005 |
| JP | 2005-174415 | 6/2005 |
| JP | 2006-066658 | 3/2006 |
| WO | WO 2004/013645 | 2/2004 |
| WO | WO 2005/073744 | 8/2005 |

OTHER PUBLICATIONS

Official Notice from Japanese Patent Office in corresponding Japanese Patent Application No. 2006-088619, mailed Feb. 1, 2011, 7 pages.

Official Notice from Japanese Patent Office in corresponding Japanese Patent Application No. 2006-088620, mailed Feb. 1, 2011, 7 pages.

Official Notice from Japanese Patent Office in corresponding Japanese Patent Application No. 2006-102316, mailed Feb. 1, 2011, 4 pages.

Official Notice from Japanese Patent Office in corresponding Japanese Patent Application No. 2006-192059, mailed Feb. 4, 2011, 9 pages.

Official Notice from Japanese Patent Office in corresponding Japanese Patent Application No. 2006-102315, mailed Mar. 25, 2011, 8 pages.

Office Action issued in corresponding Japanese Patent Application No. 2006-088619, mailed on Jun. 10, 2011, 4 pages.

Office Action issued in corresponding Japanese Patent Application No. 2006-088620, dated Jun. 10, 2011, 3 pages.

Office Action issued in corresponding Japanese Patent Application No. 2006-102316, dated Jun. 10, 2011, 4 pages.

Office Action issued in corresponding Japanese Patent Application No. 2006-192059, dated Jun. 10, 2011, 4 pages.

Decision of Dismissal of Amendment mailed Jan. 27, 2012, in counterpart Japanese Patent Application No. 2006-088619 (3 pages).

Final Decision of Rejection mailed Feb. 3, 2012, in counterpart Japanese Patent Application No. 2006-102315 (2 pages).

English-language extended European Search Report from the European Patent Office mailed Dec. 20, 2011, in counterpart European Application No. 07740148.7 (11 pages).

* cited by examiner

HALL ELEMENT OFFSET VOLTAGE
[mV/mA/√NUMBER OF ELEMENTS]
(MAGNETIC FOCUSING PLATE: 200μm)

|  | No1 | No2 | No3 | AVERAGE | 3σ |
|---|---|---|---|---|---|
| x-OFFSET | 1.176349 | 0.680544 | 0.448262 | 0.768385 | 1.11572 |
| y-OFFSET | 1.293169 | 0.596325 | 0.994327 | 0.961274 | 1.048788 |

FIG.5A

(MAGNETIC FOCUSING PLATE: 230μm)

| No1 | No2 | No3 | No4 | No5 | No6 | No7 | No8 | No9 | No10 | No11 | No12 | No13 | No14 | No15 | AVERAGE | 3σ |
|---|---|---|---|---|---|---|---|---|---|---|---|---|---|---|---|---|
| 1.657706 | 1.044043 | 2.039209 | 2.037852 | 1.524655 | 1.591181 | 0.430379 | 1.774465 | 2.435647 | 1.756815 | 1.375312 | 1.889866 | 2.005268 | 1.027751 | 2.352829 | 1.662865 | 1.595092 |
| 1.276203 | 1.35902 | 1.243619 | 1.607473 | 0.944933 | 0.845824 | 0.928641 | 2.170903 | 2.039209 | 2.154611 | 1.508363 | 2.204844 | 1.409254 | 1.37667 | 1.407896 | 1.498498 | 1.367242 |

FIG.5B

| THICKNESS OF SECOND METAL FILM | STRAIN |
|---|---|
| 0.05μm | PRESENT |
| 0.07μm | PRESENT |
| 0.1μm | NONE |
| 1μm | NONE |
| 2μm | NONE |
| 3μm | NONE |
| 4μm | NOT MEASURABLE |

FIG.20

| THERMAL EXPANSION COEFFICIENT OF MAGNETIC ALLOY FILM [ppm/°C] | MAGNETIC CHARACTERISTICS OF HALL ELEMENT |
|---|---|
| 8 | STRAIN PRESENT |
| 10 | STRAIN NOT PRESENT |
| 12 | STRAIN NOT PRESENT |
| 15 | STRAIN NOT PRESENT |
| 18 | STRAIN PRESENT |
| 20 | STRAIN PRESENT |

FIG.23

MAGNETIC SENSOR AND METHOD OF MANUFACTURING THEREOF

CROSS REFERENCE TO RELATED APPLICATIONS

This application is a U.S. National Phase of International Application No. PCT/JP2007/056710, filed Mar. 28, 2007, and claims the priority of Japanese Application No. 2006-11100, filed Apr. 13, 2006, the content of both of which is incorporated herein by reference.

TECHNICAL FIELD

The present invention relates to a magnetic sensor, and in particular, relates to a magnetic sensor comprising a plurality of Hall elements and magnetic substance with a magnetic amplification function, which enables detecting a direction of a magnetic field in two or three dimensions. The present invention further relates to a method of manufacturing the magnetic sensor.

BACKGROUND ART

Conventionally, a magnetic sensor, combining Hall elements and a magnetic substance (magnetic flux concentrator) with a magnetic amplification function, has been known. For example, Patent Document 1 relates to a magnetic field direction detection sensor, which enables detecting a direction of a magnetic field in three dimensions and comprises a magnetic flux concentrator, having a flat shape, and Hall elements, positioned at end regions of the magnetic flux concentrator.

This arrangement provides effects of enabling, by means of the magnetic flux concentrator, a horizontal magnetic field to be detected and the magnetic field to be amplified at regions at which the Hall elements are present.

A magnetic sensor combining Hall elements can be integrated, because Hall elements are not positioned at end regions of a permanent magnet but disposed at rotational axis regions at which horizontal components of a magnetic field are maximized by the effect of a magnetic flux concentrator.

FIG. 1 is an arrangement diagram for describing the conventional magnetic sensor (see Patent Document 1), and in the figure, 1 indicates a semiconductor substrate, 2a and 2b indicate Hall elements, 3 indicates a buffer coat layer, 4 indicates a base layer, and 5 indicates a magnetic flux concentrator.

FIG. 2 is a process diagram for describing a method for manufacturing the magnetic flux concentrator of the conventional magnetic sensor and shows a process of adhering a magnetic tape onto a semiconductor substrate 11. First, an IC (Integrated Circuit)-processed wafer is prepared. Next, using an epoxy adhesive, the magnetic tape (amorphous metal tape) is adhered onto the wafer. A magnetic flux focusing pattern 14 is then formed by photolithography. Etching of the amorphous metal is then performed. The magnetic flux concentrator is thus formed on the semiconductor substrate 11. Here, a central position of a magnetic sensing surface of each Hall element is positioned near a circumferential edge of the magnetic flux concentrator. Also here, the magnetic flux concentrator has a film thickness of no less than 20 µm. The magnetic flux concentrator is prepared by processing a thick magnetic tape by wet etching. In this case, the epoxy adhesive is approximately 2 to 4 µm thick, and a distance from a magnetic sensing surface of each Hall element to a bottom surface of the magnetic flux concentrator is approximately 6 to 8 µm. Also in this case, the magnetic flux concentrator 5 is 15 µm thick. Furthermore, an angle formed by a top surface of the semiconductor substrate 1 and a side surface of the magnetic flux concentrator 5 is substantially 90°.

Patent Document 2 relates to a magnetic sensor, including a magnetic flux concentrator, with a magnetic amplification function, which detects magnetic flux, leaking from an end of the magnetic flux concentrator, by semiconductor Hall elements.

And with this arrangement, after forming the semiconductor Hall elements, the magnetic flux concentrator is formed by depositing a soft magnetic thin film by electroplating. And a two-layer structure is formed by depositing a Ti thin film, which is a first metal film, to 0.05 µm by sputtering, thereafter using a dry film resist to form a pattern corresponding to a magnetic substance in a form of an opening, and depositing a Ni—Fe alloy thin film, which is a second metal film, to 0.07 µm.

The Ti thin film that is the first metal film is adopted for improving close adhesion of a basing insulating layer and the Ni—Fe alloy thin film.

In this manufacturing method, the magnetic sensor including the Hall elements and the magnetic flux concentrator formed of the soft magnetic material can be manufactured compactly and readily by a manufacturing method compatible with an LSI (Large Scale Integrated circuit) manufacturing process. Furthermore, the magnetic sensor can be made high sensitivity by shortening a distance between the semiconductor Hall elements and the magnetic flux concentrator.

With the arrangement using the magnetic tape as the magnetic flux concentrator, there is a problem in that a large stress is generated at the Hall elements below the tape due to the tape being adhered onto the semiconductor substrate using the epoxy adhesive. Also when the magnetic tape is used, it is impossible to control the thickness of the magnetic substance.

Furthermore with the magnetic sensor shown in FIG. 1, because the adhesive used between the semiconductor circuit 1 and the magnetic flux concentrator 5 shrinks upon hardening, a high tensile force is applied to the wafer and the wafer becomes warped as a whole. When the adhesive is applied more thickly, the adhesive force increases, but the sensitivity decreases, more shrinkage occurs, and it is difficult to process and form the coated adhesive thinly and uniformly. Also, when the adhesive is applied thinly, although the adhesive force becomes weaker, the adhesive layer being made thin improves the sensor sensitivity.

It was thus difficult to improve the sensitivity and reduce variations of the sensitivity while maintaining the adhesive force (relaxing the stress) and taking into consideration the thickness of the adhesive.

Also conventionally, the thickness of the adhesive is set to 2 to 4 µm from the standpoint of obtaining a predetermined sensitivity, and this thickness of the adhesive cannot be kept uniform readily. Consequently, the distance from the magnetic sensing surface of each Hall element to the bottom surface of the magnetic flux concentrator in the conventional magnetic sensor must be restricted to no more than 6 to 8 µm, and it is difficult to suppress variations of the sensitivity while maintaining this distance.

In a case of using the manufacturing method described in Patent Document 2 to manufacture the magnetic sensor with the arrangement shown in FIG. 1, because the base metal layer and the magnetic flux concentrator contact the semiconductor substrate across the same area, a stress applied to the Hall elements and a mounted IC becomes large and this consequently causes generation of an offset voltage.

However, if the areas of contact with the semiconductor substrate are made small by reducing the areas of the magnetic substance and the base metal layer, positional shifts of the magnetic substance cause magnetic flux density variations at the regions at which the Hall elements are present and magnetic saturation is quickened. Therefore, the magnetic substance and the base metal layer are required to have areas of a certain size or more.

Furthermore, in the case of the magnetic sensor thus manufactured, the metal film with the two-layer structure is stacked between the semiconductor substrate and the magnetic flux concentrator by stacking the Ti thin film, which is the first metal film, to 0.05 μm by sputtering and thereafter depositing the Ni—Fe alloy thin film, which is the second metal film, to 0.07 μm. However, the Ti thin film that is the first metal layer is provided to improve close adhesion of the basing insulating layer and the Ni—Fe alloy thin film and no consideration whatsoever is made in regard to the coefficient of thermal expansions of the two metal films and the magnetic flux concentrator. Therefore, magnetostriction occurs due to the thermal expansion difference between the NiFe in the magnetic flux concentrator 5 and the Ti, W, or TiW alloy in the metal film, and the magnetic characteristics of the magnetic sensor that combines the Hall elements and the magnetic substance are consequently unstable.

Furthermore, in the case of the magnetic sensor shown in FIG. 1, because the central position of the magnetic sensing surface of each Hall element is positioned near the circumferential edge of the magnetic flux concentrator, diameter variations and positional shifts within a horizontal plane of the magnetic flux concentrator cause large variations of the sensitivity along the X-axis and Y-axis, and the unbalance of the sensitivity along the X-axis and Y-axis and a sensitivity along a Z-axis.

The above-mentioned patent documents do not make any statements in particular in regard to the distance from the magnetic sensing surface of each Hall element to the bottom surface of the magnetic flux concentrator, and this distance is guessed to be approximately 6 to 8 μm in consideration of adhesive force, processability, sensitivity, and variations of the sensitivity.

As another problem, with the magnetic sensor shown in FIG. 1, because the angle formed by the top surface of the semiconductor substrate 1 and the side surface of the magnetic flux concentrator 5 is substantially 90°, a perpendicular side surface of the magnetic flux concentrator is positioned very close to each Hall element, although the magnetic flux concentrates at the side surface and thereby improves the magnetic detection function. However the magnetic flux concentrates excessively, magnetic saturation occurs and it becomes difficult to secure linearity of sensor output.

The present invention has been made in view of the above issues, and an object thereof is to provide a magnetic sensor, which combines Hall elements and a magnetic substance having a magnetic amplification function, and with which extremely stable magnetic characteristics are realized by consideration of an area of contact of a base layer of the magnetic substance and a semiconductor substrate, and a method for manufacturing the magnetic sensor.

Another object of the present invention is to provide a magnetic sensor, with which control of thickness of the magnetic substance is enabled to prevent generation of a large stress in the Hall element, and a method for manufacturing the magnetic sensor.

Yet another object of the present invention is to provide a magnetic sensor, with which extremely stable magnetic characteristics are realized by provision of a metal film with a two-layer structure between the semiconductor substrate and the magnetic substance, and a method for manufacturing the magnetic sensor.

Yet another object of the present invention is to provide a two-dimensional or a three-dimensional magnetic sensor, which combines Hall elements and a magnetic substance, having a magnetic amplification function, and with which a central position of a magnetic detecting surface of each Hall element is disposed inward from an end of the magnetic substance by just a predetermined distance and sensitivity variations along an X-axis and Y-axis and sensitivity variations along a Z-axis are controlled, a three-dimensional magnetic sensor, with which a sensitivity along the X-axis and Y-axis and a sensitivity along the Z-axis are well-balanced, and a method for manufacturing these magnetic sensors.

Yet another object of the present invention is to provide a magnetic sensor, with which variations of the sensitivity are suppressed by consideration of a distance between each Hall element and the magnetic substance, and a method for manufacturing the magnetic sensor.

Yet another object of the present invention is to provide a magnetic sensor, with which a side surface of the magnetic substance has a tapered shape and linearity can be secured without improving sensitivity or lowering sensitivity by consideration of a degree of concentration of magnetic flux onto the magnetic substance and consideration of magnetic saturation, and a method for manufacturing the magnetic sensor.

Patent Document 1: Japanese Patent Laid-Open No. 2002-71381

Patent Document 2: Japanese Patent Laid-Open No. 2003-142752

DISCLOSURE OF THE INVENTION

To achieve the object above, the present invention provides a magnetic sensor, including: a semiconductor substrate, on which plural Hall elements are disposed; and a magnetic substance, having a magnetic amplification function is disposed above the semiconductor substrate; and with this magnetic sensor, a base layer, serving as a backing of the magnetic substance, is disposed above the semiconductor substrate, the base layer has a coefficient of thermal expansion differing from that of the Hall elements and an area covering a region of each Hall element at least partially, and the magnetic substance has an area larger than the area of the base layer.

The magnetic substance and the base layer are preferably circular or polygonal.

The base layer is preferably a resin or a metal.

The thickness of the magnetic substance is preferably no less than 1 μm and less than 15 μm and more preferably no less than 5 μm and no more than 14 μm.

Preferably, the magnetic substance is formed by electroplating.

Preferably, the base layer comprises a first metal film, formed of Ti, W, or a TiW alloy and stacked above the semiconductor substrate, and a second metal film, containing Cu and stacked above the first metal film.

In this case, the second metal film preferably has a film thickness of 0.1 to 2 μm. Or, the second metal film preferably has a coefficient of thermal expansion of 15 to 20 ppm/° C.

The magnetic substance is preferably formed of an alloy, containing at least two types of metal selected from the group consisting of Ni, Fe, and Co, and has a coefficient of thermal expansion of 10 to 15 ppm/° C.

Preferably a buffer coat polyimide layer is stacked between the semiconductor substrate and first metal film.

Preferably, the base layer comprises a first metal film, formed of Ti, W, or a TiW alloy and stacked above the semiconductor substrate, and the magnetic substance comprises a second metal film, formed of NiFe with a film thickness of 0.1 to 3 µm by sputtering or vacuum vapor deposition above the first metal film, and a magnetic alloy film, formed of NiFe and disposed above the second metal film and formed by electroplating.

In this case, the first metal film preferably has a film thickness of 0.01 to 1 µm. Also, a buffer coat layer may be placed between the semiconductor substrate and the first metal film.

Preferably, a central position of a magnetic sensing surface of each Hall element is positioned in a region of 0.55 to 1.0 times in a radial distance from a center of the magnetic substance.

Preferably, a distance from a magnetic sensing surface of each Hall element to a bottom surface of the magnetic substance is 9 to 20 µm.

Preferably, the bottom surface of the magnetic substance is disposed to cover the region of each Hall element at least partially and a side surface of the magnetic substance has a tapered shape.

In particular, the magnetic substance preferably has an inverted tapered shape, with which an inner taper angle α between a top surface of the semiconductor substrate and a side surface of the magnetic substance is an obtuse angle.

Preferably, the taper angle α is such that $90°<\alpha\leq120°$. Meanwhile, the magnetic substance also preferably has a forward tapered shape, with which the inner taper angle α between the top surface of the semiconductor substrate and the side surface of the magnetic substance is an acute angle.

The above-described magnetic sensor can be manufactured by the steps of: embeddedly forming the Hall elements on the top surface of the semiconductor substrate; forming a buffer coat layer above the Hall elements; forming, above the buffer coat layer, a base layer, having a coefficient of thermal expansion differing from that of the Hall elements and having an area covering the region of each Hall element at least partially; and forming, above the base layer, a magnetic substance, having an area larger than the area of the base layer.

In particular, the step of forming the base layer and the step of forming the magnetic substance preferably include the steps of: forming a base metal layer for electroplating above the buffer coat layer; forming a resist above the base metal layer by photolithography so that an opening is formed at peripheries of magnetic sensing surfaces of the Hall elements; and forming the magnetic substance in the opening above the base metal layer by electroplating.

By this method, the magnetic substance can be formed controllably to have a film thickness of no less than 1 µm and less than 15 µm and particularly in a range of 5 µm to 14 µm.

As another manufacturing method, the step of forming the base layer and the step of forming the magnetic substance preferably include the steps of: forming a first metal film, formed of Ti, W, or a TiW alloy, above the buffer coat layer; forming a second metal film, containing Cu, above the first metal film; and forming a magnetic alloy film, having a magnetic amplification function, above the second metal film. In this case, the second metal film is preferably formed to have a film thickness of 0.1 to 2 µm.

The second metal film is preferably formed by sputtering or vacuum vapor deposition.

The magnetic alloy film, having the magnetic amplification function, is preferably formed by electroplating above the second metal film.

As another manufacturing method, the step of forming the base layer and the step of forming the magnetic substance preferably include the steps of: forming a first metal film, formed of Ti, W, or a TiW alloy, above the buffer coat layer by sputtering or vacuum vapor deposition; forming a second metal film, formed of NiFe and having a film thickness of 0.1 to 3 µm, above the first metal film by sputtering or vacuum vapor deposition; and forming a magnetic alloy film, formed of NiFe, above the second metal film by electroplating.

In this case, the first metal film is preferably formed to have a film thickness of 0.01 to 1 µm.

As another manufacturing method, the step of forming the base layer and the step of forming the magnetic substance preferably include the steps of: forming a base metal layer for electroplating above the buffer coat layer; forming a resist above the base metal layer by resist patterning so that an opening with a tapered shape is formed above the Hall elements; forming the magnetic substance, with the magnetic amplification function, in the opening above the base metal layer by electroplating and making the bottom surface of the magnetic substance cover the region of each Hall element at least partially.

Preferably in this case, the magnetic substance is formed by photolithography so as to have an inverted tapered shape, with which an inner taper angle α between a top surface of the semiconductor substrate and the side surface of the magnetic substance is an obtuse angle. In particular the taper angle α is preferably such that $90°<\alpha\leq120°$.

Also preferably, the magnetic substance is formed by photolithography so as to have a forward tapered shape, with which the inner taper angle α between the top surface of the semiconductor substrate and the side surface of the magnetic substance is an acute angle.

With the present invention, because the base layer, stacked above the semiconductor substrate, having the coefficient of thermal expansion differing from that of the Hall elements, and having the area covering the region of each Hall element at least partially, and the magnetic substance, having the magnetic amplification function, disposed above the base layer, and having the area larger than the area of the base layer, are provided, an effect of enabling an area of contact of the base layer of the magnetic substance and the semiconductor substrate to be made small to lessen the generation of an offset voltage and thereby enabling a magnetic sensor with extremely stable magnetic characteristics to be realized is exhibited.

Also, because an epoxy adhesive, such as is used conventionally, is not used and a polyimide layer is stacked once and the magnetic flux concentrator is formed thereafter, an effect of preventing the problem of warping of the wafer due to the epoxy adhesive during processing is exhibited.

Furthermore, with the present invention, because the first metal film, formed of Ti, W, or the TiW alloy and stacked above the semiconductor substrate, the second metal film, containing Cu and stacked above the first metal film, and the magnetic alloy film, having the magnetic amplification function and stacked above the second metal film are provided, the metal film in contact with the magnetic flux concentrator that is the magnetic alloy film is provided with a two-layer structure and an effect of enabling a magnetic sensor with extremely stable magnetic characteristics to be realized by adjustment of the coefficient of thermal expansion of the metal film and matching of the coefficient of thermal expansion at an interface with the magnetic flux concentrator to the coefficient of thermal expansion of the magnetic flux concentrator is exhibited.

Furthermore, with the present invention, the film thickness of the magnetic substance is made no less than 1 µm and less than 15 µm, and the control of the film thickness is enabled by forming of the magnetic substance by electroplating, to realize a magnetic sensor, in which a large stress is not occurred at the Hall elements. In particular with Si monolithic Hall elements, the generation of an offset voltage by a piezoelectric effect is suppressed, thereby magnetic measurements with higher precision are realized.

Furthermore, with the present invention, as the center of the magnetic detecting surface of each Hall element is positioned in the region of 0.55 to 0.95 times or 0.95 to 1 times in the radial distance from the center of the magnetic flux concentrator, a magnetic sensor is realized. In the sensor, a sensitivity change along the X-axis and Y-axis is small with respect to diameter variations of the magnetic flux concentrator, and with respect to positional shifts along with a horizontal plane of the magnetic flux concentrator. Thus the sensitivity along the X-axis and Y-axis and the sensitivity along a Z-axis are well-balanced. Well balanced sensitivities for 3 axes are exhibited in the sensor.

Furthermore, with the present invention, because the distance from the magnetic sensing surface of each Hall element to the bottom surface of the magnetic flux concentrator is set at about 9~20 μm, although an absolute value of sensitivity may be lowered. Changes of sensitivity with respect to positional shifts along with a plane of magnetic flux concentrator, and changes of distance in a vertical direction between the magnetic flux concentrator and magnetic sensing surface are small. By having an intermediate layer not be thin, thickness adjustment has some allowance and brings an effect of suppressing variations of the sensitivity. In addition, because the intermediate layer is not so thin, an effect of suppressing sensitivity variations due to a void, etc., at the bottom surface side of the magnetic flux concentrator is provided.

Furthermore, with the present invention, because the side surface of the magnetic substance has the tapered shape, a magnetic sensor, with which the side surface of the magnetic substance is made to have the tapered shape and with which linearity can thereby be secured without changing the sensitivity in consideration of a degree of concentration of magnetic flux at the magnetic substance and in consideration of magnetic saturation, can be realized.

BRIEF DESCRIPTION OF THE DRAWINGS

FIG. 5A is a diagram for describing a relationship between a diameter of a magnetic flux concentrator and an offset voltage in a case where the magnetic flux concentrator is circular and shows a case where the diameter of the magnetic flux concentrator is 200 μm;

FIG. 5B is a diagram for describing a relationship between the diameter of the magnetic flux concentrator and the offset voltage in a case where the magnetic flux concentrator is circular and shows a case where the diameter of the magnetic flux concentrator is 230 μm;

FIG. 20 is a table of relationships of magnetic strain and coefficient of thermal expansion of a magnetic alloy film;

FIG. 23 is a table of relationships of magnetic strain and coefficient of thermal expansion of a magnetic alloy film;

BEST MODE FOR CARRYING OUT THE INVENTION

Embodiments of the present invention shall now be described with reference to the drawings.

Figure 1:
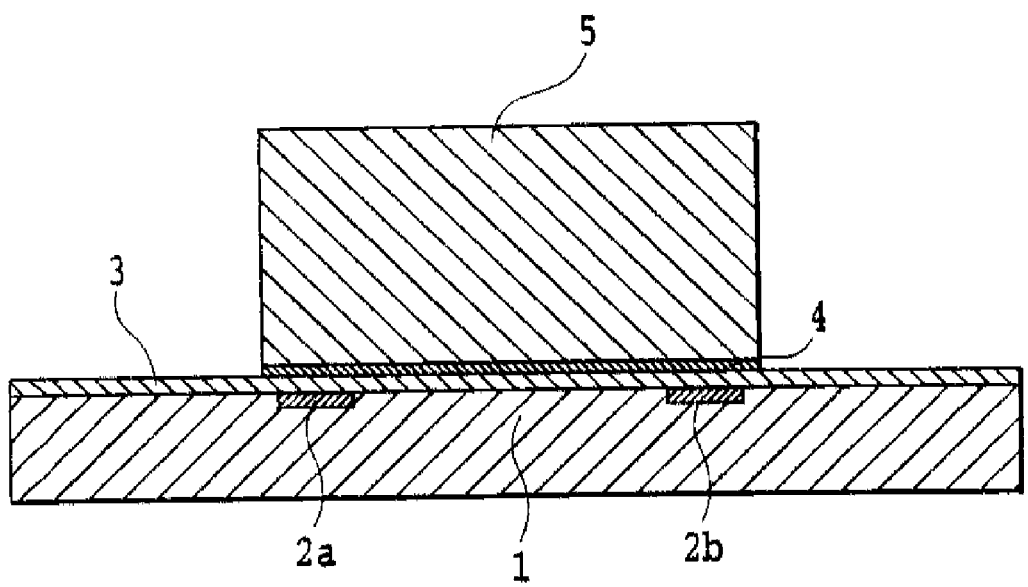
FIG. 1 is an arrangement diagram for describing a conventional magnetic sensor.
Figure 2:
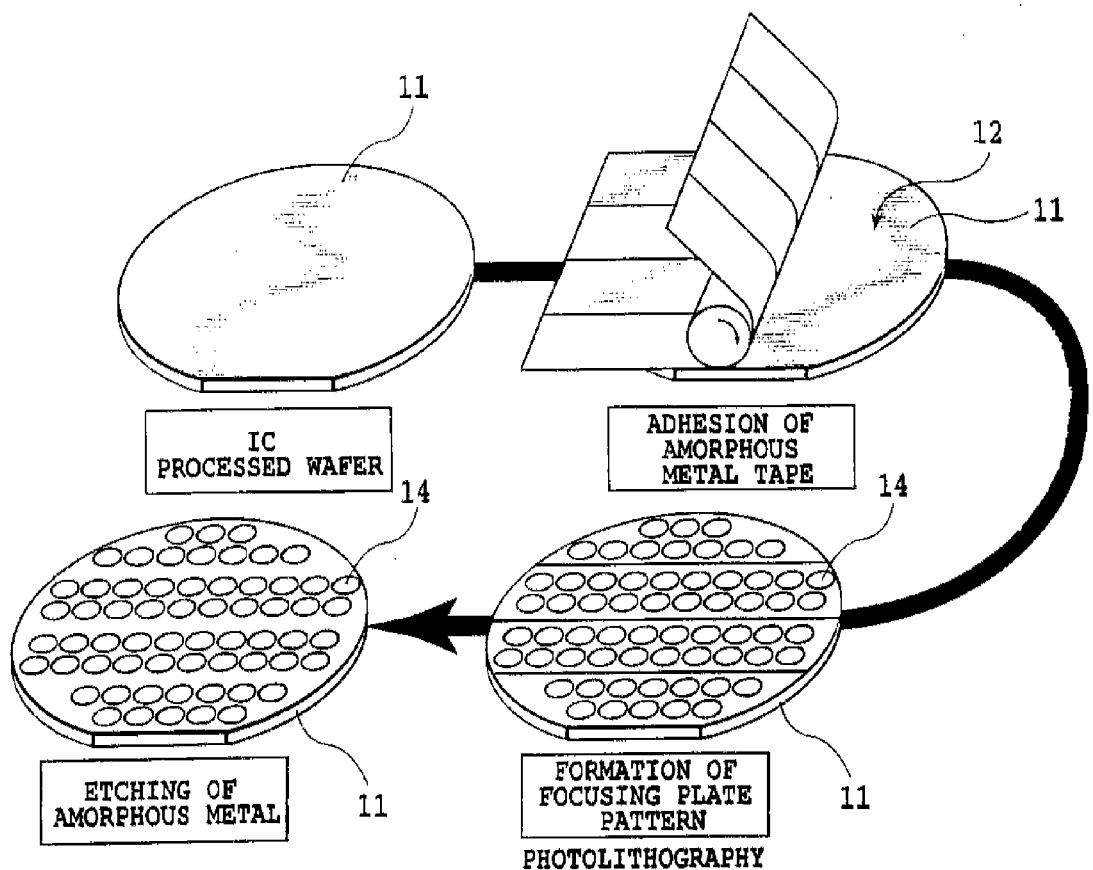
FIG. 2 is a process diagram for describing a method for manufacturing a magnetic flux concentrator of the conventional magnetic sensor.
Figure 3:
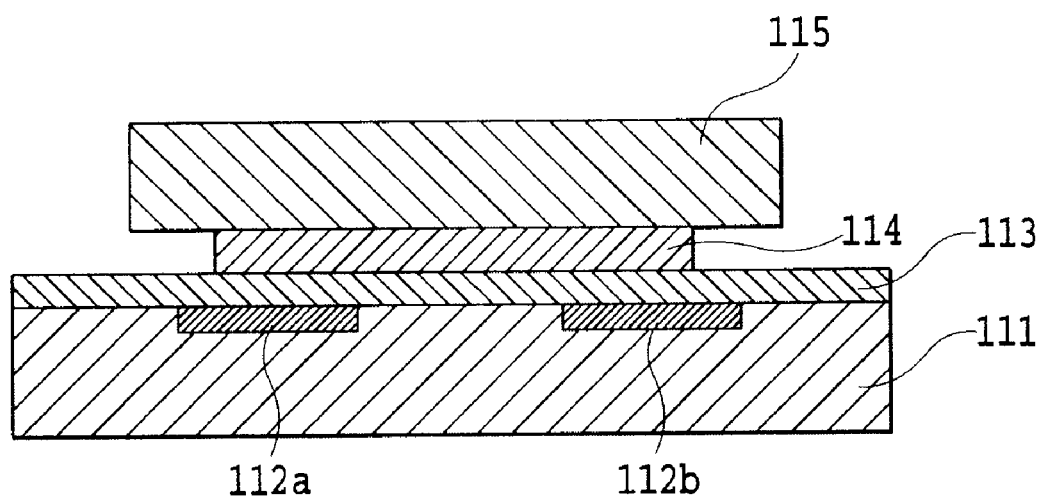
FIG. 3 is an arrangement diagram for describing an embodiment of a magnetic sensor according to the present invention.

FIG. 3 is an arrangement diagram for describing an embodiment of a magnetic sensor according to the present invention, and in the figure, the reference numeral 111 indicates a semiconductor substrate, 112a and 112b indicate Hall elements, 113 indicates a buffer coat layer, 114 indicates a base layer, and 115 indicates a magnetic flux concentrator.

With the magnetic sensor according to the present invention, the semiconductor substrate 111, in which the Hall elements 112a and 112b are embeddedly formed, is combined with the magnetic flux concentrator 115, having a magnetic amplification function. On the semiconductor substrate 111 are disposed the Hall elements 112a and 112b that are embedded while being mutually spaced apart by a predetermined distance so as to be coplanar to a top surface of the semiconductor substrate 111.

The buffer coat layer 113 is placed on the Hall elements 112a and 112b and above the semiconductor substrate 111, and on the buffer coat layer 113 is stacked the base layer 114, formed of metal or resin and having a coefficient of thermal expansion differing from that of the Hall elements 112a and 112b and having an area covering a region of each of the Hall elements 112a and 112b at least partially. On the base layer 114 is stacked the magnetic flux concentrator 115, which has a magnetic amplification function and has an area larger than the area of the base layer 114. The magnetic flux concentrator 115 is formed of NiFe. The magnetic flux concentrator 115 and the base layer 114 are preferably circular or polygonal.

Figure 4A:
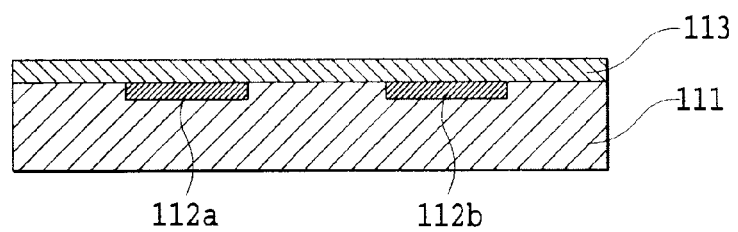
FIG. 4A is a sectional process diagram for describing an embodiment of a method for manufacturing the magnetic sensor according to the present invention.
Figure 4B:
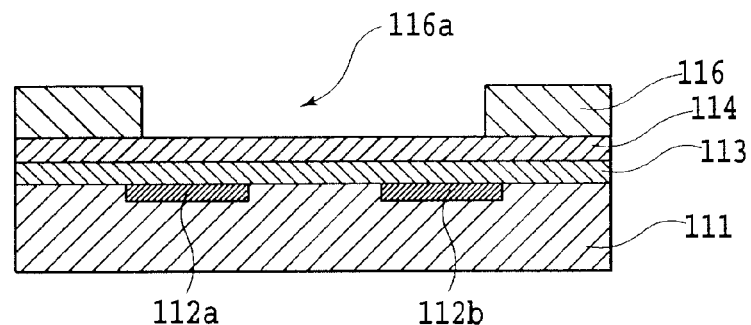
FIG. 4B is a sectional process diagram for describing the embodiment of the method for manufacturing the magnetic sensor according to the present invention.

FIGS. 4A and 4B are sectional process diagrams for describing an embodiment of a method for manufacturing the magnetic sensor according to the present invention.

First, as shown in FIG. 4A, an IC circuit and the Hall elements are formed on the Si substrate 111 by an LSI manufacturing process. That is, the Hall elements 112a and 112b are embeddedly formed in the semiconductor substrate 111, formed of Si or GaAs, so as to be coplanar to the top surface of the semiconductor substrate 111 while being mutually spaced apart by a predetermined distance (preparation of a magnetic sensor chip). Polyimide is then patterned above the substrate and the Hall elements to form the buffer coat layer 113, formed of polyimide, on the semiconductor substrate 111 (polyimide patterning).

Next, as shown in FIG. 4B, a layer of TiW and Cu is formed as the electroplating base layer 114 on the semiconductor substrate 111 by sputtering or vacuum vapor deposition and a pattern of the magnetic flux concentrator 115 is prepared by photolithography. That is, the base layer 114, formed of metal (or resin) and having the coefficient of thermal expansion differing from that of the Hall elements 112a and 112b, is formed by sputtering on the buffer coat layer 113 (forming of a base layer). A resist 116 is then formed on the base layer 114 by resist patterning so that a portion on the Hall elements 112a and 112b becomes an opening 116a (forming of a resist pattern).

Figure 4C:
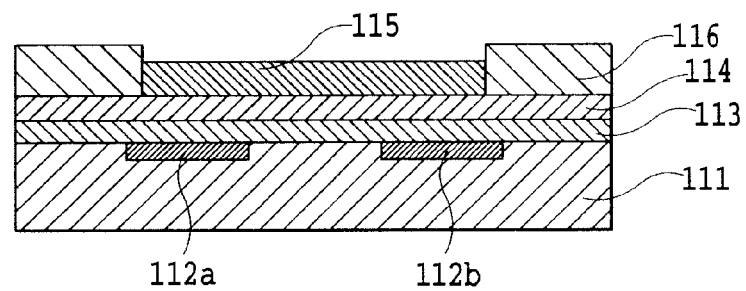
FIG. 4C is a sectional process diagram for describing the embodiment of the method for manufacturing the magnetic sensor according to the present invention.

Next, as shown in FIG. 4C, the magnetic flux concentrator 115 is formed above the pattern by electroplating. That is, the magnetic flux concentrator 115, formed of NiFe and having the magnetic amplification function, is formed by electroplating in the opening 116a above the base layer 114 (magnetic substance plating process). The magnetic flux concentrator 115 is formed by preparing an Fe—Ni based alloy by electroplating and preferably comprises a permalloy or superpermalloy (Fe—Ni based alloy) and more preferably comprises such an alloy with Co added because magnetic hysteresis is then reduced. Furthermore, the magnetic flux concentrator 115 preferably comprises permendur (Fe—Co based alloy) or sendust (Fe—Si—Al based alloy).

Figure 4D:
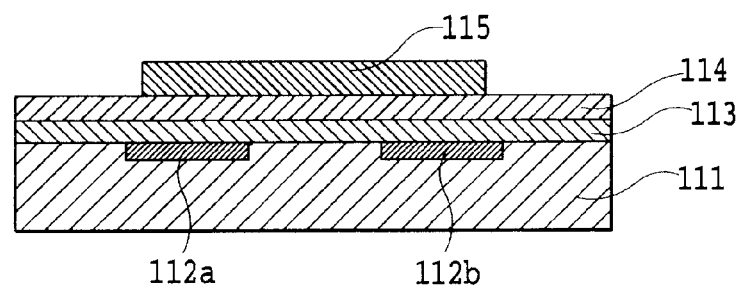
FIG. 4D is a sectional process diagram for describing the embodiment of the method for manufacturing the magnetic sensor according to the present invention.

Next, as shown in FIG. 4D, the resist pattern 116 is peeled (resist pattern removal). As a result, the magnetic flux concentrator 115 is left on the base layer 114.

Figure 4E:
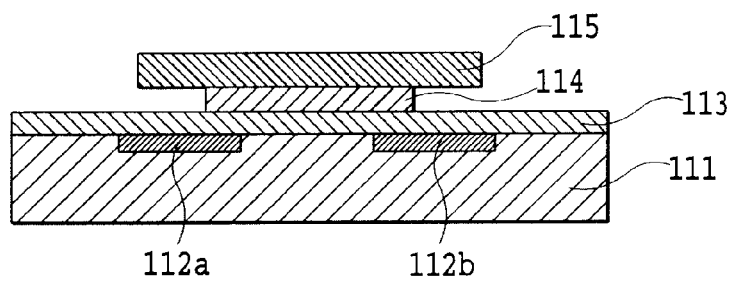
FIG. 4E is a sectional process diagram for describing the embodiment of the method for manufacturing the magnetic sensor according to the present invention.

Next, as shown in FIG. 4E, the base layer 114 is over-etched so that it becomes smaller than the magnetic flux concentrator 115. That is, the base layer 114 is over-etched using NiFe as a mask. In this case, NiFe is not etched and just the base layer 114 is etched selectively. Because the base layer 114, which has an area that covers the region of each of the Hall elements 112a and 112b at least partially and is less than the area of the magnetic flux concentrator 115, is thereby formed, an area of contact of the base layer 114 of the magnetic flux concentrator 115 with the semiconductor substrate 111 is made small to lessen the generation of an offset voltage, and a magnetic sensor of extremely stable magnetic characteristics is thus prepared.

Finally, the plural magnetic sensor chips are separated into individual chips by dicing (dicing).

Figure 6:
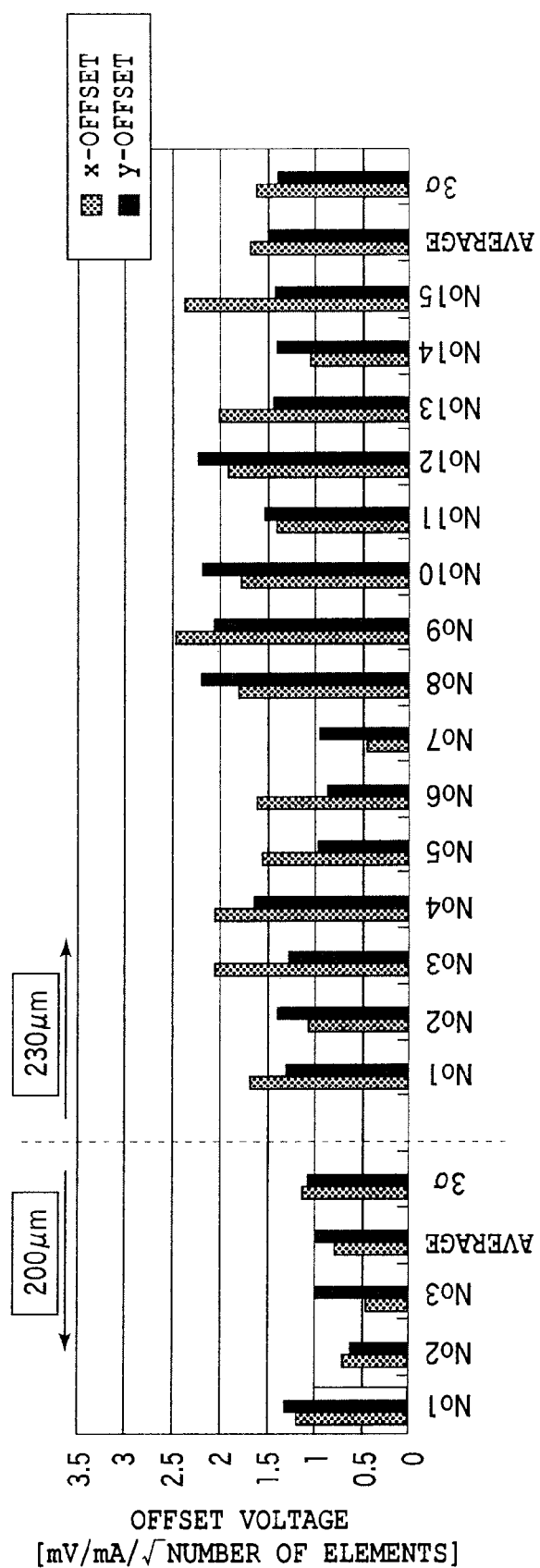
FIG. 6 is a graph based on the data shown in FIGS. 5A and 5B.

FIGS. 5A, 5B, and 6 are diagrams for describing relationships between a diameter of the magnetic flux concentrator and the offset voltage in a case where the magnetic flux concentrator and the base metal layer are circular and equal in area, with FIG. 5A indicating the offset voltage (mV/mA/√number of Hall elements; number of samples=3) of the Hall elements in a case where the diameter of the magnetic flux concentrator is 200 μm and FIG. 5B indicating the offset voltage (mV/mA/√number of Hall elements; number of samples=15) of the Hall elements in a case where the diameter of the magnetic flux concentrator is 230 μm. FIG. 6 is a graph based on the data shown in FIGS. 5A and 5B.

In a case where one magnetic flux concentrator has a diameter of 230 μm and another magnetic flux concentrator has a diameter of 200 μm, a ratio of the areas of contact of the base layers of the magnetic flux concentrators of different diameters with the semiconductor substrate is (230×230)/(200×200)=1:0.75. In this case, the Hall element offset voltage ratio is 1:0.6 (measured value). This signifies that when the diameter of the magnetic flux concentrator 115 is made small to make the area of contact with the semiconductor substrate 111 small, the offset voltage becomes small. This is clear from the graph shown in FIG. 6.

Because the magnetic flux concentrator 115 has the magnetic amplification function and is required to have a certain area with respect to the regions in which the Hall elements are positioned, there is obviously a limit to how small its area can be made. Thus by making small the area of contact of the base layer 114 of the magnetic flux concentrator 115 with the semiconductor plate 111, the offset voltage can be made small. With the present invention, it was found based on such measured values of the offset voltage that the offset voltage can be made small by making small the area of contact of the base layer with the semiconductor substrate.

With the present invention, in order to eliminate a cause of generation of offset voltage due to the base metal layer and the magnetic flux concentrator contacting the semiconductor substrate across the same area and the stress applied to the Hall elements and other mounted ICs thereby being large, the area of contact of the base layer of the magnetic flux concentrator with the semiconductor substrate is made small to lessen the generation of offset voltage and thereby provide a magnetic sensor with extremely stable magnetic characteristics.

<Film Thickness of the Magnetic Flux Concentrator>

Figure 7A:
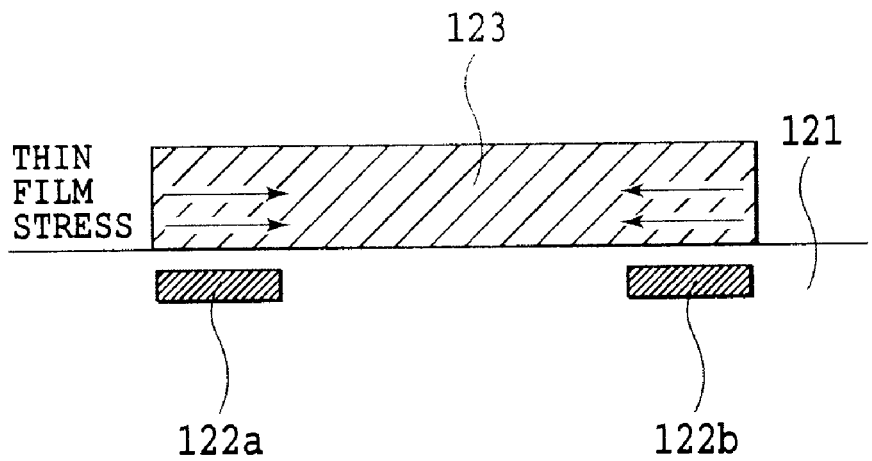
FIG. 7A is a diagram of a film thickness of the magnetic flux concentrator of the magnetic sensor according to the present invention and shows an arrangement with a thin film.
Figure 7B:
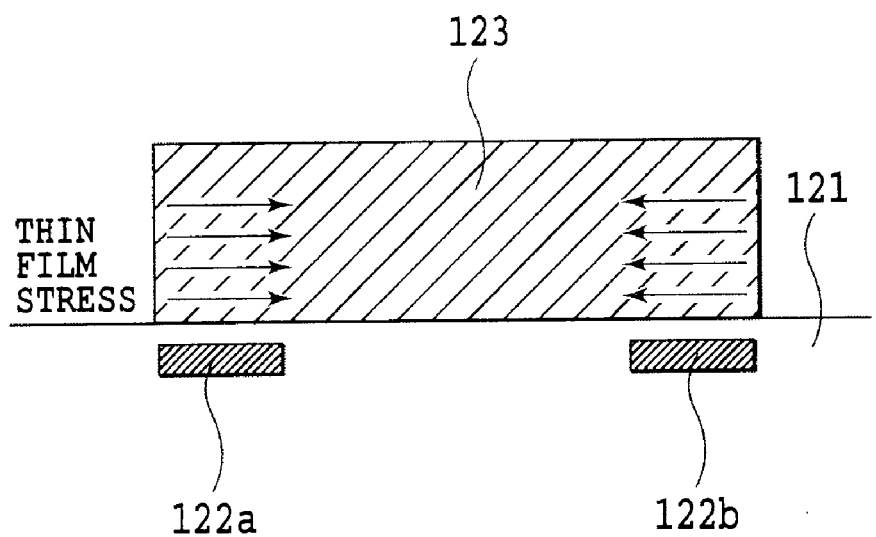
FIG. 7B is a diagram of the film thickness of the magnetic flux concentrator of the magnetic sensor according to the present invention and shows an arrangement with a thick film.

FIGS. 7A and 7B are diagrams of magnetic sensors with magnetic flux concentrators that differ in film thickness, with FIG. 7A showing an arrangement with a thin film, and FIG. 7B showing an arrangement with a thick film.

On a semiconductor substrate 121 are disposed the plurality of Hall elements 122a and 122b that are embedded so as to be coplanar to a top surface of the semiconductor substrate 121 while being mutually spaced apart by a predetermined distance. In actuality, an IC layer, etc., is disposed between the Hall elements and the magnetic flux concentrator.

A base metal layer (not shown), for electroplating the magnetic flux concentrator 123, is disposed above the semiconductor substrate 121 and the Hall elements 122a and 122b. On the base metal layer, the magnetic flux concentrator 123, having the magnetic amplification function, is formed by electroplating in a manner enabling control of film thickness. The magnetic flux concentrator 123 is formed of NiFe and a magnetic substance is used. The magnetic flux concentrator 123 and the base metal layer are preferably circular or polygonal.

A bottom surface of the magnetic flux concentrator 123 is positioned so as to cover a region of each of the Hall elements 122a and 122b at least partially. The film thickness of the magnetic flux concentrator 123 is preferably 1 μm to less than 15 μm and optimally 5 to 14 μm.

Figure 8:
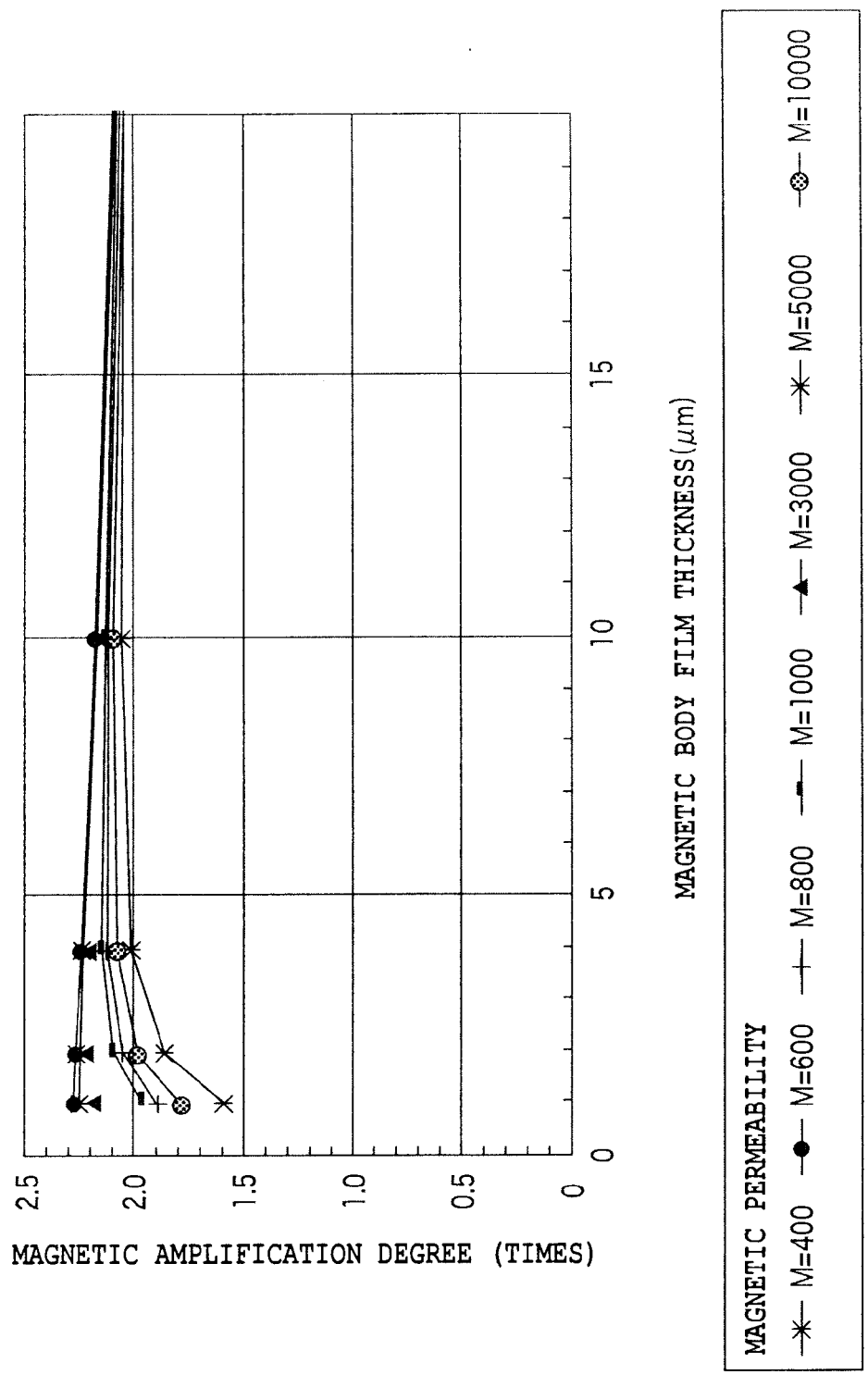
FIG. 8 is a diagram of relationships between a magnetic amplification factor of the magnetic flux concentrator and the film thickness of the magnetic flux concentrator.

FIG. 8 is a diagram of relationships between a magnetic amplification factor of the magnetic flux concentrator and the film thickness of the magnetic flux concentrator. The magnetic amplification factor depends not only on the film thickness but on magnetic permeability as well, and the thinner the film thickness and the lower the magnetic permeability, the lower the magnetic amplification factor. Even if the film thickness of the magnetic flux concentrator becomes 1 μm, if a magnetic permeability of no less than 3000 can be secured for the magnetic substance, the magnetic amplification factor does not degrade. A magnetic substance with a magnetic permeability of 3000 can adequately be realized by an electroplating process.

The grounds for the optimal film thickness of the magnetic flux concentrator having a lower limit of 5 μm and an upper limit of 14 μm shall now be described.

Magnetic saturation occurs more quickly the thinner the magnetic substance. Present applications that make use of this concept include an electric compass and rotation angle sensors. With saturation magnetic flux density values (typically, approximately 1 T) of magnetic materials that can normally be obtained, magnetic saturation probably begins to occur at around 20 mT when the film thickness is no more than 5 μm. It is considered that if magnetic saturation occurs quickly, considerable restrictions are placed on magnetic design. It is thus considered that, with the exception of special applications, use of a magnetic material at a film thickness of no more than 5 µm is difficult in practical terms.

With an electric compass, a slight magnetic focusing effect is exhibited in a thickness direction (vertical direction) of the magnetic flux concentrator and a sensitivity of the electric compass is thereby increased by approximately 10%. With a film thickness of no more than 5 µm, the magnetic focusing effect in the vertical direction becomes substantially zero and lowering of S/N occurs. An extremely thin film thickness (for example, no more than 1 µm) is not practical in that magnetic amplification effects in horizontal directions (X and Y directions) also decrease. The lower limit of the film thickness is thus set to 5 µm.

In addition, as a merit in terms of processing, by making the film thickness no less than 5 µm, the magnetic permeability specification required of the magnetic substance can be relaxed significantly and a process margin can be secured for film forming as is clear from FIG. 8.

In the above-mentioned Patent Documents, the film thickness of the magnetic flux concentrator is set to 15 µm. When the film thickness increases to no less than 15 µm, a large stress is generated in the Hall elements as mentioned above. The upper limit value is thus set to no more than 14 µm in the present invention.

As shown in FIG. 7B, when the film thickness of the magnetic flux concentrator 123 is made thick, the stress applied to the Hall elements 122a and 122b becomes large and the offset voltage increases due to the piezoelectric effect. Precision of detection by the Hall elements thereby degrades.

When the film thickness of the magnetic flux concentrator 123 is made thin as shown in FIG. 7A, the stress applied to the Hall elements 122a and 122b becomes small and offset changes become small. Degradation of the detection precision of the Hall elements is thus lessened.

Because the film thickness of the magnetic flux concentrator disposed on the semiconductor substrate is thus set to no less than 1 µm and less than 15 µm and preferably 5 to 14 µm and thus thinner than the conventional film thickness of 15 to 20 µm and because control of the film thickness is enabled by electroplating, a magnetic sensor, with which a large stress is not generated at the Hall elements, can be realized.

It has thus become possible to make the film thickness of the magnetic flux concentrator, which was conventionally 15 to 20 µm, as thin as 5 to 14 µm by electroplating and the stress applied to the Hall elements can thereby be lessened. In particular with Silicon monolithic Hall elements, the generation of offset voltage by the piezoelectric effect is suppressed and magnetic measurements of higher precision can be realized.

<Distance Between the Hall Elements and the Magnetic Substance>

A distance A from a magnetic sensing surface of each of the Hall elements 122a and 122b to the bottom surface of the magnetic flux concentrator 123 is 9 to 20 µm. Although an absolute value of sensitivity is thereby lowered, changes of sensitivity with respect to positional shifts within a plane and changes of distance in a vertical direction of the magnetic flux concentrator are made small, and by enabling an intermediate layer to be thick, thickness adjustment is enabled and an effect of suppressing variations of the sensitivity is exhibited.

Figure 9:
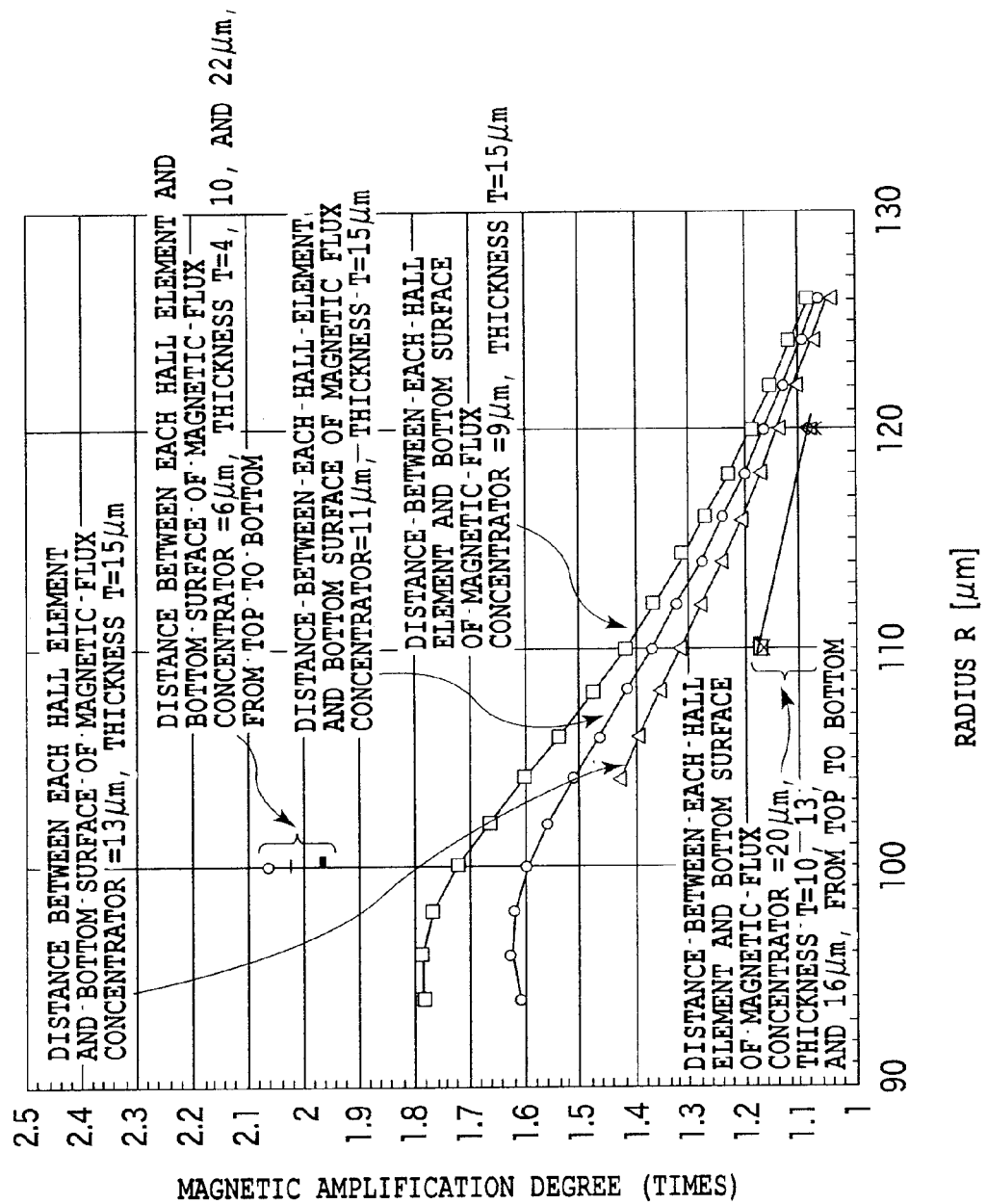
FIG. 9 is a diagram of relationships between a radius and a magnetic amplification degree of the magnetic flux concentrator in the magnetic sensor according to the present invention and shows trends of sensitivity variations as an edge of the magnetic flux concentrator becomes positioned further away from each Hall element (from a central position of each magnetic detecting surface)

FIG. 9 is a diagram of relationships between a radius and a magnetic amplification degree of the magnetic flux concentrator in the magnetic sensor according to the present invention as determined by three-dimensional magnetostatic field analysis using an integral element method. It was confirmed that, at a certain point in the graph, there is a difference of only approximately 7% between an actually measured magnetic amplification degree and a calculation value. As can be understood from FIG. 9, when the radius R=100 µm, the magnetic amplification degree is approximately 2.05 times when the distance A, from the magnetic sensing surface of each of the Hall elements to the bottom surface of the magnetic flux concentrator, is 6 µm and the thickness of the magnetic flux concentrator is 10 µm. The magnetic amplification degree is approximately 1.72 when the distance=9 and the thickness T=15. It is approximately 1.6 when the distance A=11 and the thickness T=15. And it is approximately 1.6 when the distance A=15 and the thickness T=15. When the radius R=110 µm, the magnetic amplification degree is approximately 1.42 when the distance=9 and the thickness T=15. It is approximately 1.36 when the distance=11 and the thickness T=15. It is approximately 1.32 when the distance=15 and the thickness T=15. And it is approximately 1.17 when the distance=20 and the thickness T=13.

It can thus be understood that, even if the distance between the magnetic sensing surface of each of the Hall elements and the bottom surface of the magnetic flux concentrator is set in a range of 9 to 20 µm, by selecting the radius R of the magnetic flux concentrator for the required magnetic amplification degree, a practical magnetic sensor can be obtained. In regard to the decreasing of sensitivity, the magnetic amplification degree at an initial stage can be compensated by suitable selections of an arrangement of Hall elements of high sensitivity or combined usage with an integration function of an IC. And thus the practical decreasing of the sensitivity due to increase of the vertical distance does not present a problem in terms of practical use.

Figure 10:
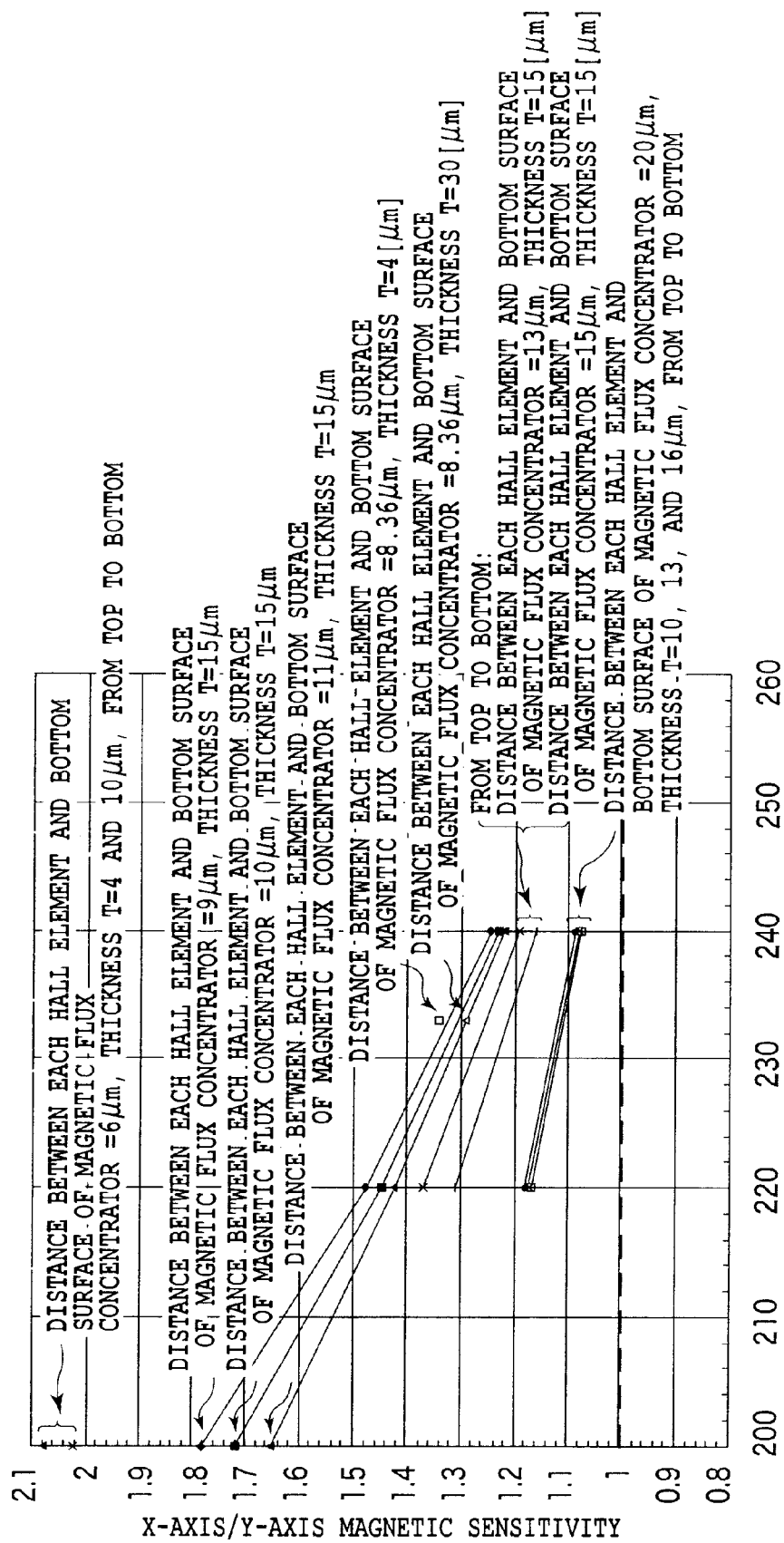
FIG. 10 is a diagram of relationships of a magnetic sensitivity along an X-axis and a Y-axis with respect to the diameter of the magnetic flux concentrator as analyzed by three-dimensional magnetostatic field analysis using an integral element method.

FIG. 10 is a diagram of relationships of magnetic sensitivities along an X-axis and a Y-axis with respect to the diameter of the magnetic flux concentrator as analyzed by three-dimensional magnetostatic field analysis using the integral element method. And the figure indicates the magnetic sensitivity in the horizontal directions. Calculations were performed with the positions of each of the Hall elements in horizontal and vertical planes being fixed, and the calculations were performed with the thickness and the radius R of the magnetic flux concentrator and with the distance between the magnetic sensing surface of each of the Hall elements and the bottom surface of the magnetic flux concentrator as parameters.

It can be understood that, as the distance between the magnetic sensing surface of each of the Hall elements 112a and 112b and the bottom surface of the magnetic flux concentrator 115 changes from 9 to 20 µm, the absolute value of sensitivity decreases. But it can be understood that the change of sensitivity with respect to the change of vertical position of the magnetic flux concentrator becomes smaller. Thus, likewise, it can be understood that the change of sensitivity becomes smaller with respect to positional shifts along the horizontal plane. Thus by letting the intermediate layer not be thin, thickness adjustment is enabled and the variations of the sensitivity are suppressed.

Figure 11:
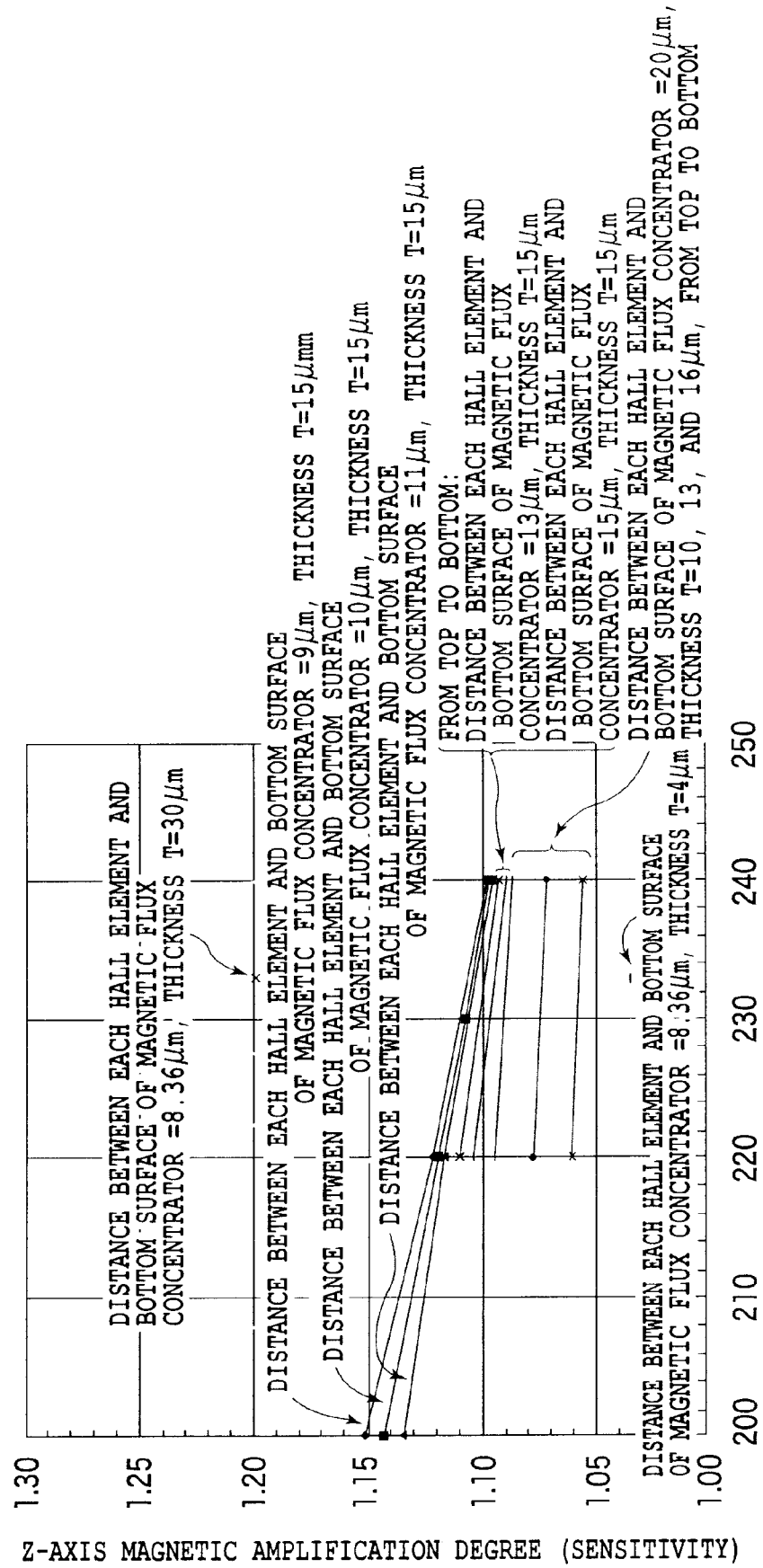
FIG. 11 is a diagram of relationships of a magnetic sensitivity along a Z-axis with respect to the diameter of the magnetic flux concentrator as analyzed by three-dimensional magnetostatic field analysis using the integral element method.

FIG. 11 is a diagram of relationships of a magnetic sensitivity along a Z-axis with respect to the diameter of the magnetic flux concentrator, as analyzed by three-dimensional magnetostatic field analysis using the integral element method. And the figure indicates the magnetic sensitivity in the vertical direction. Calculations were performed with the positions of each of the Hall elements in the horizontal and vertical planes being fixed, and with the thickness and with the radius R of the magnetic flux concentrator and with the distance between the magnetic sensing surface of each of the Hall elements and the bottom surface of the magnetic flux concentrator, as parameters.

It can be understood that, as the distance between the magnetic sensing surfaces of each of the Hall elements 112a and 112b and the bottom surface of the magnetic flux concentrator 115 changes from 9 to 20 μm, the absolute value of sensitivity decreases. Thus the change of sensitivity with respect to the change of vertical position of the magnetic flux concentrator becomes smaller. Likewise, it can be understood that the change of sensitivity becomes smaller with respect to positional shifts along the horizontal plane. Thus by letting the intermediate layer not be thin, thickness adjustment is enabled and variations of the sensitivity are suppressed.

Figure 12:
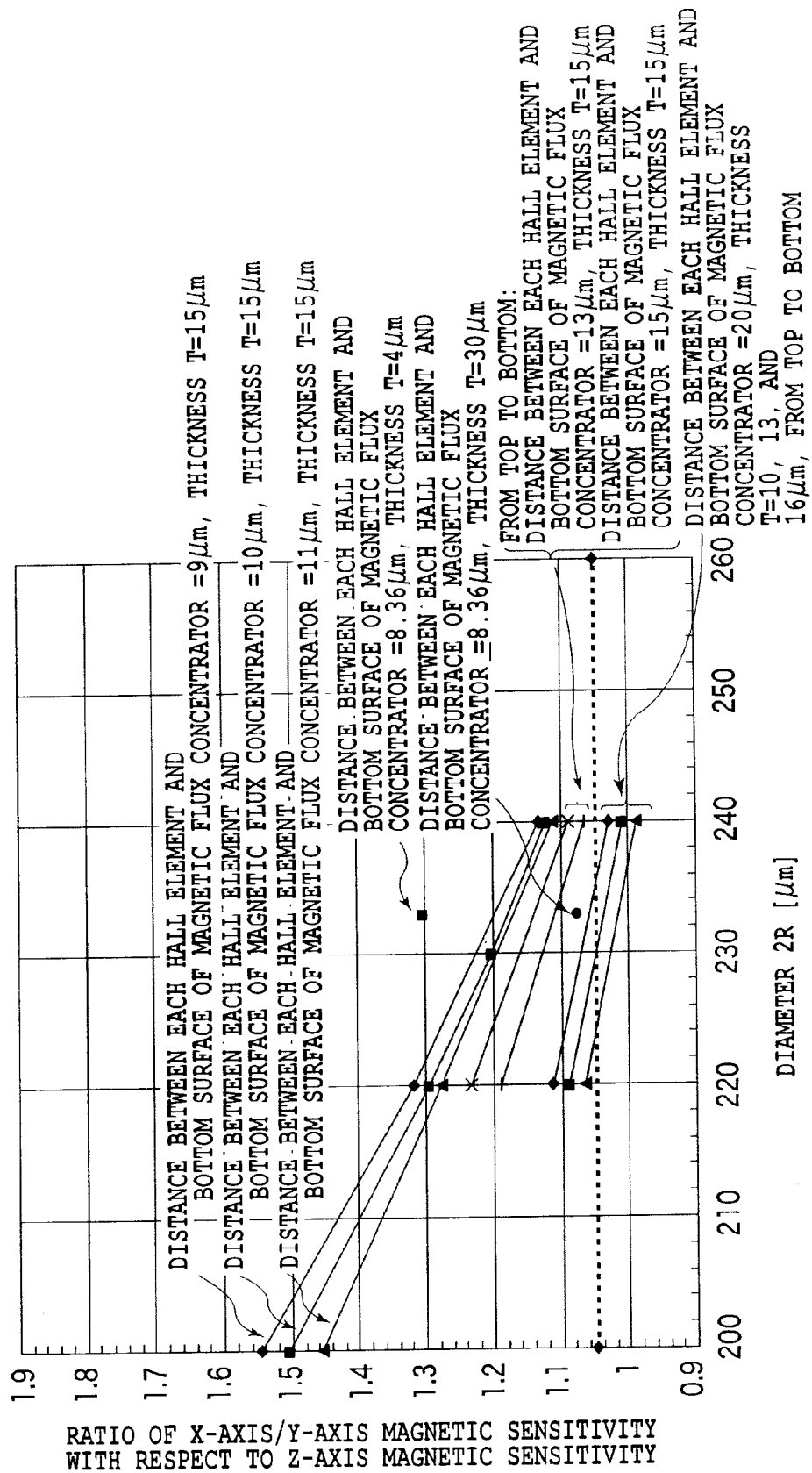
FIG. 12 is a diagram of relationships of a ratio of the magnetic sensitivity along the X-axis and Y-axis to the magnetic sensitivity along the Z-axis with respect to the diameter of the magnetic flux concentrator.

FIG. 12 is a diagram of relationships of a ratio of the magnetic sensitivities along the X-axis and Y-axis to the magnetic sensitivity along the Z-axis, with respect to the diameter of the magnetic flux concentrator, as analyzed by three-dimensional magnetostatic field analysis using the integral element method. And the figure indicates the ratio of the magnetic sensitivity along the horizontal directions to the magnetic sensitivity along the vertical direction. Calculations were performed, with the thickness and the radius R of the magnetic flux concentrator, and with the distance between the magnetic sensing surface of each of the Hall elements and the bottom surface of the magnetic flux concentrator as parameters, with the positions of each of the Hall elements in the horizontal and vertical positions being fixed.

It can be understood that, as the distance between the magnetic sensing surface of each of the Hall elements 112a and 112b and the bottom surface of the magnetic flux concentrator 115 changes from 9 to 20 μm, the absolute value of the sensitivity ratio decreases and approaches 1, the change of sensitivity with respect to the change of vertical distance of the magnetic flux concentrator becomes smaller. Thus, likewise, it can be understood that the change of sensitivity becomes smaller with respect to horizontal positional shifts. Thus by having the intermediate layer not be thin, thickness adjustment is enabled, and variations of sensitivity and sensitivity ratio are suppressed.

Supposing that absolute values of the sensitivity ratio (X/Z or Y/Z) are set to no less than 1, in the example of the present numerical analysis, the absolute value of the sensitivity ratio becomes 1 when the distance between the magnetic sensing surface of each of the Hall elements and the bottom surface of the magnetic flux concentrator=20 μm, and when the diameter of the magnetic flux concentrator=240 μm, and when the thickness of the magnetic flux concentrator=16 μm. If a balance of sensitivity among the X-axis·Y-axis and the Z-axis is not required as 1, a diameter may be set in a radius of 200 μm or beyond 200 μm, and the distance may be set in the range of 9 to 20 μm or beyond.

With the magnetic sensor according to the present invention, when the distance between the magnetic sensing surface of each of the Hall elements and the bottom surface of the magnetic flux concentrator is in the range of 9 to 20 μm, a magnetic sensor can be realized, in which changes of sensitivity are lessened and variations of sensitivity are suppressed, with respect to horizontal position shifts and changes of distance in the vertical position of the magnetic flux concentrator.

<Positions of the Hall Elements in a Radial Direction of the Magnetic Substance>

With the present invention, a distance between central positions of magnetic detecting surfaces of Hall elements and radial edges of the magnetic flux concentrator is set so that the central positions of the magnetic detecting surfaces of the Hall elements 112a and 112b are positioned in a region of approximately 60% to approximately 90% of a radial distance from a central position of the magnetic flux concentrator 115. Or, the radial distance at a central position of the magnetic detecting surfaces from the center of the magnetic substance (geometrical center of the disk-like magnetic flux concentrator) is in a region of approximately 0.6 to approximately 0.9 times. For example, when the radius of the magnetic flux concentrator is 115 μm, the central position of the magnetic detecting surface of each Hall element is positioned in a region of 115×0.6 to 115×0.9=69 to 103.5 μm. That is, the central position of the magnetic detecting surface is positioned in a region that is located 11.5 to 46 μm inward from the edge of the magnetic flux concentrator.

In actuality, the magnetic flux concentrator is formed above the positions of the Hall elements, which are formed on the semiconductor substrate. The magnetic flux concentrator, which has a radius of 115 μm, is formed, where the center of Hall elements is located at 87 μm from the center of the magnetic flux concentrator, and thus, the distance from the center of Hall elements to the edge of magnetic concentrator is 28 μm.

For example, in a case where the radius of the magnetic flux concentrator is 135 μm, the central position of the magnetic detecting surface of each of the Hall elements is formed in a region of 135×0.6 to 135×0.9=81 to 121 μm. That is, the central position of each magnetic detecting surface is positioned in a region 14 to 57 μm inward from the edge of the magnetic flux concentrator.

Figure 13:
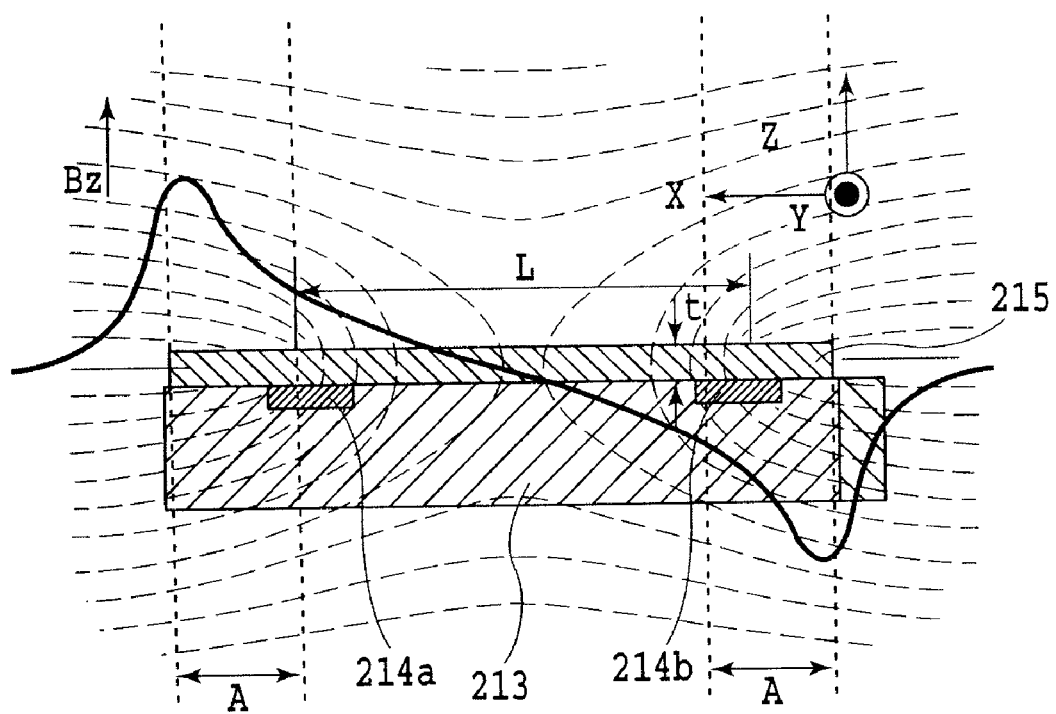
FIG. 13 is a diagram of a magnetic flux distribution in a periphery of Hall elements in the magnetic sensor according to the present invention.

FIG. 13 is a diagram of a magnetic flux distribution in a periphery of the Hall elements in the magnetic sensor according to the present invention. In the figure, the solid line curve indicates horizontal to vertical magnetic flux conversion characteristics. It takes peak values respectively, at edges of a semiconductor substrate 213 in FIG. 13, and the characteristics incline at a gradual curve toward the center. As can be understood from this characteristic diagram, a gradual inclined curve is presented at the inner side of the semiconductor substrate, and by positioning the Hall elements in the inclined portion, variations of sensitivity along the X-axis and Y-axis are made smaller with respect to diameter variations and positional shifts within the horizontal plane of the magnetic flux concentrator, and the sensitivities along the X-axis and Y-axis and the sensitivity along the Z-axis can be balanced well.

FIG. 9 shows sensitivity variation trends, as the edge of the magnetic flux concentrator moves farther from each Hall element (central position of the magnetic detecting surface). It can be understood that, as the radius (size) of the magnetic flux concentrator increases and the distance between the Hall elements and the edge of the magnetic flux concentrator increases, sensitivity changes become smaller, even though the sensitivity decreases. Results done by three-dimensional magnetostatic field analysis based on the integral element method are indicated below. Calculations are performed with the relative magnetic permeability and the positions in the horizontal plane of the Hall elements being fixed. The ordinate indicates a degree of the magnetic amplification with respect to an input magnetic field strength. It can be understood that the change of a degree of the magnetic amplification becomes more uniform in regions where the magnetic profile is rectilinear.

Referring to FIG. 10, it can be understood that, as the edge position of the magnetic flux concentrator moves farther from the position of each Hall element in the horizontal plane (as the radius R increases), the sensitivities along the X-axis and Y-axis decrease. And it can be understood that, when the thickness of the magnetic flux concentrator is 15 μm, a degree of the magnetic amplification in the horizontal direction becomes 1 when the diameter 2R becomes a little over 270

μm. In regard to variations of the thickness of the magnetic flux concentrator, for example, if a thickness of approximately 4 to 5 μm is to be considered for the magnetic flux concentrator, approximately 280 μm is feasible as the diameter of the magnetic flux concentrator (this corresponds to a radius R of 140 μm, with the central position of the magnetic detecting surface of each Hall element is 87 μm in radius from the center, and the central position of the magnetic detecting surface is 53 μm from the edge of the magnetic flux concentrator. And thus the ratio becomes 87/140=0.62).

If 2R=200 μm, the ratio becomes 87/100=0.87. When considering the tolerance of the completed dimensions of the magnetic flux concentrator, an upper limit of approximately 0.9 is required.

Referring to FIG. 11, calculations are performed with the thickness and the radius R of the magnetic flux concentrator and with the distance between the magnetic sensing surface of each Hall element and the bottom surface of the magnetic flux concentrator as parameters, with the positions of the Hall elements in the horizontal plane being fixed.

It can be understood that, as the edge position of the magnetic flux concentrator moves farther from the position of each Hall element in the horizontal plane (as the radius R increases), the sensitivity along the Z-axis decreases. And, when the thickness of the magnetic flux concentrator is 15 μm, a degree of the magnetic amplification in the horizontal direction becomes 1 when the diameter 2R becomes a little over 300 μm. In regard to variations of the thickness of the magnetic flux concentrator, for example, if a thickness of 30 μm is to be considered for the magnetic flux concentrator, approximately 300 μm or more is feasible as the diameter of the magnetic flux concentrator (this corresponds to a radius R of 150 μm, with the central position of the magnetic detecting surface of each Hall element is 87 μm in radius from the center, and the central position of the magnetic detecting surface is 63 μm from the edge of the magnetic flux concentrator. And thus the ratio becomes 87/150=0.58).

FIG. 12 shows the ratio of the magnetic sensitivity in the horizontal direction to the magnetic sensitivity in the vertical direction. Calculations were performed with the thickness and the radius R of the magnetic flux concentrator and the distance between the magnetic sensing surface of each Hall element and the bottom surface of the magnetic flux concentrator as parameters, with the positions of the Hall elements in the horizontal plane being fixed.

It can be understood that, as the edge position of the magnetic flux concentrator moves farther from the position of each Hall element in the horizontal plane (as the radius R increases), the sensitivities along the X-axis and Y-axis decrease. And a degree of the ratio of the magnetic amplification in the horizontal direction and a degree of the magnetic amplification in the vertical direction becomes 1 when the diameter 2R becomes a little over 260 μm. In regard to variations of the thickness of the magnetic flux concentrator, for example, if a thickness of 4 μm is to be considered for the magnetic flux concentrator, approximately 280 μm is feasible as the diameter of the magnetic flux concentrator (this corresponds to a radius R of 140 μm, the central position of the magnetic detecting surface of each Hall element is 87 μm in radius from the center, and the central position of the magnetic detecting surface is 53 μm from the edge of the magnetic flux concentrator. And thus the ratio becomes 87/140=0.62). When considering the tolerance of the completed dimensions of the magnetic flux concentrator, a lower limit of at least 0.6 is required.

If each Hall element is located at a position of (X, Y)=(87, 20)μm and located in a mirrored way, the distance from the geometric center of the centers of the magnetic detecting surfaces of the Hall elements is, to be accurate, 89.27 μm. Thus with the change from 87 to 89.27, supposing that a variation of a radius of the magnetic flux concentrator, due to process, is approximately 2 to 3 μm, and the radius is set in a range of 100 to 150 μm, the ratio values are as shown in Table 1 below. Thus in this case, the ratio may be in a range from a minimum of 0.58 to a maximum of 0.92.

TABLE 1

| Case No. | Radial distance [μm] | Magnetic flux concentrator radius [μm] Central position of magnetic detecting surface [ratio] | Minimum radius [μm] Central position of magnetic detecting surface [ratio] | Maximum radius [μm] Central position of magnetic detecting surface [ratio] |
| --- | --- | --- | --- | --- |
| 1 | 89.27 | 100.00 | 97.50 | 102.50 |
|   |       | 0.8927 | 0.9156 | 0.8709 |
| 2 | 89.27 | 115.00 | 112.50 | 117.50 |
|   |       | 0.7763 | 0.7935 | 0.7597 |
| 3 | 89.27 | 140.00 | 137.50 | 142.50 |
|   |       | 0.6376 | 0.6492 | 0.6265 |
| 4 | 89.27 | 150.00 | 147.50 | 152.50 |
|   |       | 0.5951 | 0.6052 | 0.5854 |

Figure 14:
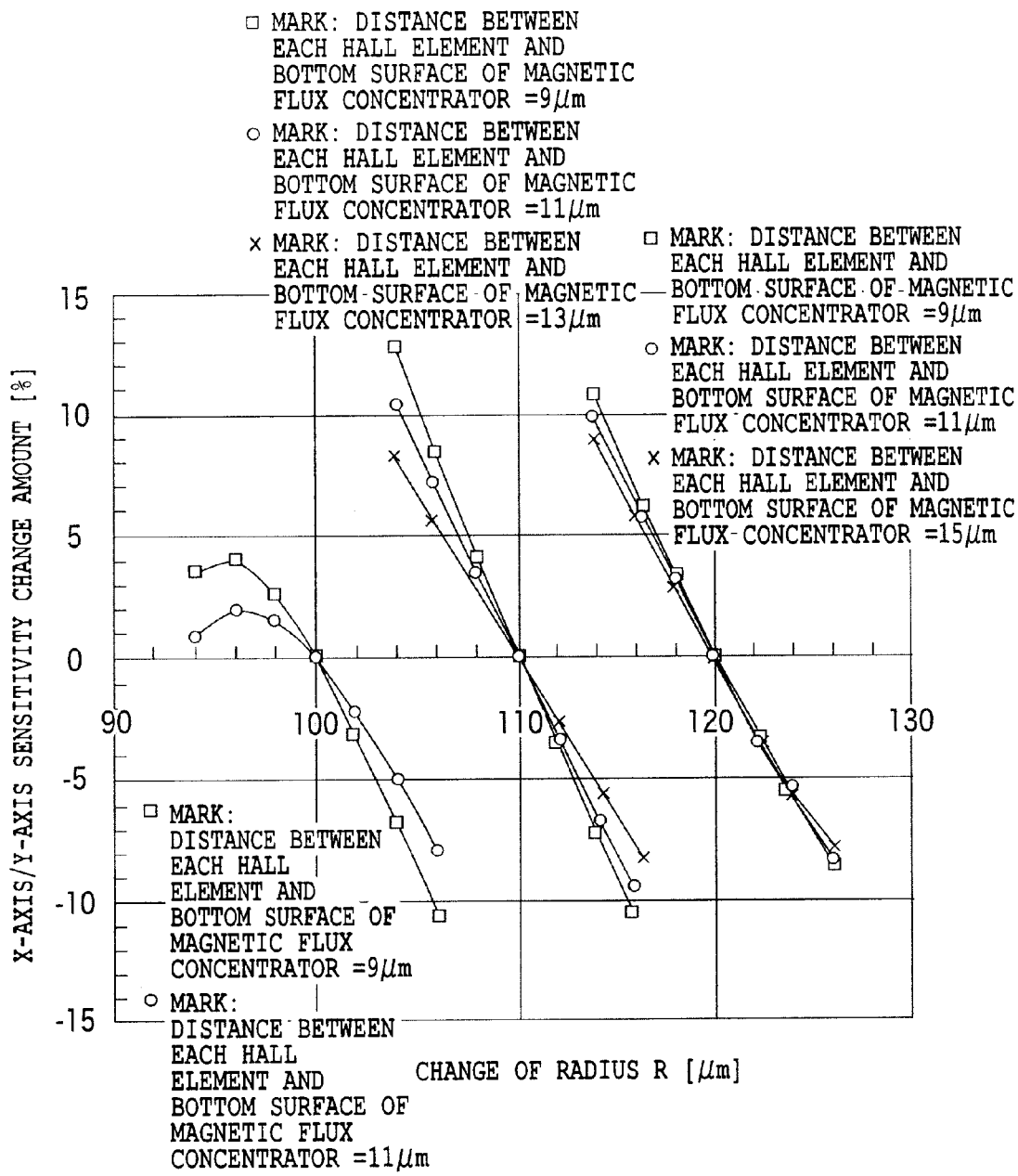
FIG. 14 is a diagram of relationships of a sensitivity change amount with respect to the radius of the magnetic flux concentrator.

FIG. 14 is a diagram of relationships of a sensitivity change amount with respect to the radius of the magnetic flux concentrator. And it shows that magnetic sensitivity variations are related to variations in the size and the vertical separation distance of the magnetic flux concentrator. The absolute sensitivity change amount is converted to a relative sensitivity change amount and plotted against the change in size of the magnetic flux concentrator. With the positions in the horizontal plane of the Hall elements being fixed, with the position in the horizontal plane of the magnetic flux concentrator, and with the position in the vertical direction of it, and with the thickness of it, and with the radius R of it, and with the distances between the magnetic sensing surface of each Hall element and the bottom surface of the magnetic flux concentrator being set, a degree of the change of magnetic amplification that is plotted with respect to the radius is increased and decreased. Within the plots, the sensitivity at a central radius is set as a reference value of 1. The plot is normalized with the reference radius. It can be understood that the sensitivity change becomes uniform, as the position of the edge of the magnetic flux concentrator moves farther from the position of each Hall element in the horizontal plane (as the radius R increases).

Figure 15:
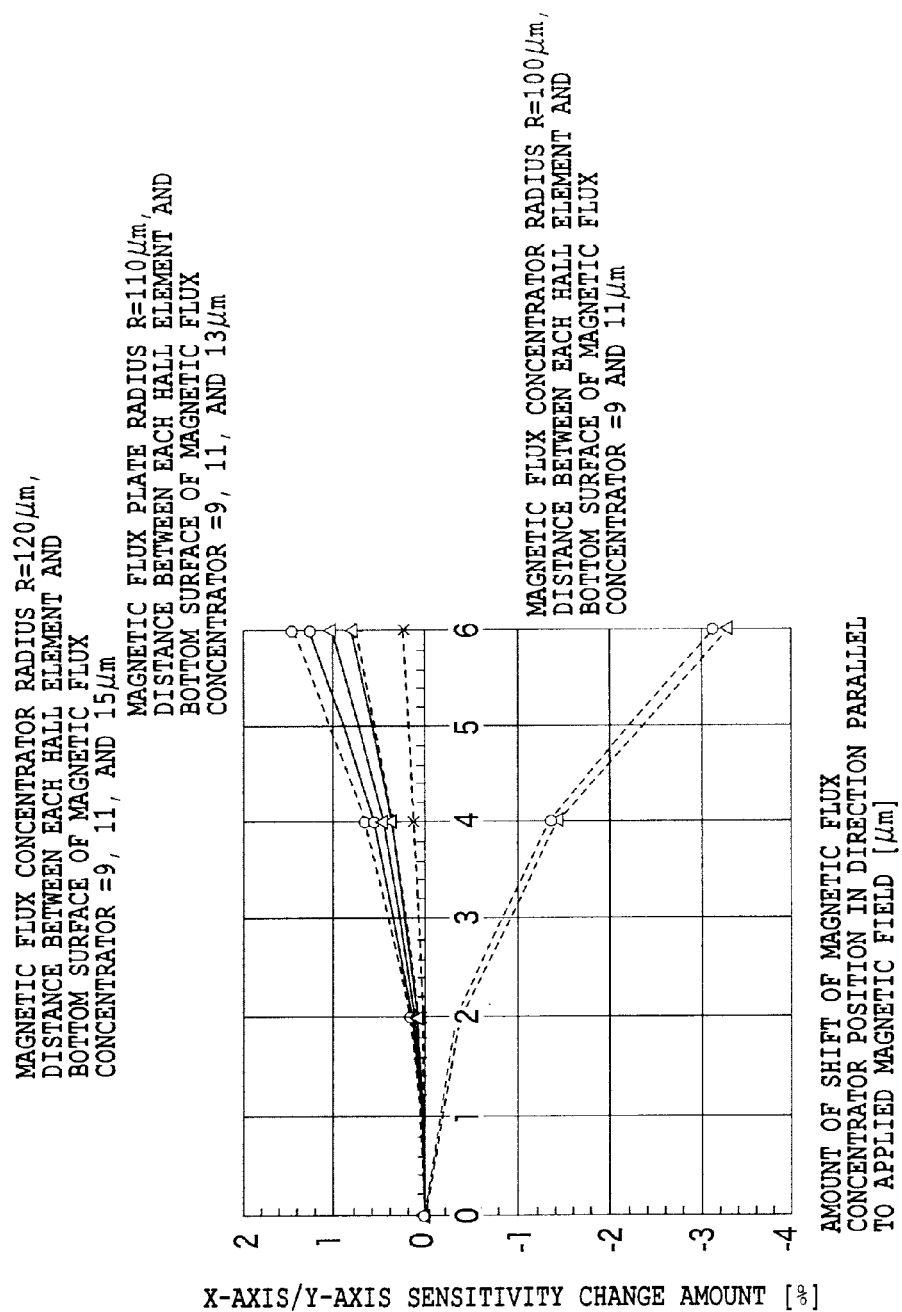
FIG. 15 is a diagram of relationships of a sensitivity change amount with respect to an amount of shift of the magnetic flux concentrator in a direction parallel to an applied magnetic field.

FIG. 15 is a diagram of relationships of a sensitivity change amount with respect to an amount of shift of the magnetic flux concentrator in a direction parallel to an applied magnetic field. And it shows the magnetic sensitivity variation with respect to a positional shift of the magnetic flux concentrator in the horizontal plane. The absolute sensitivity change amount is converted to a relative sensitivity change and plotted against the shift amount of the magnetic flux concentrator position. With the positions in the horizontal plane of the Hall elements being fixed, with the thickness and the radius R of the magnetic flux concentrator being fixed, and with the distance between the magnetic sensing surface of each Hall element and the bottom surface of the magnetic flux concentrator being fixed, (under a condition in which the geometric center of the centers of the respective magnetic detecting surfaces of the Hall elements and the center of the radius of the circular magnetic flux concentrator are matched), the sensitivity change is expressed as normalized with the target radius. It can be understood that, the sensitivity change becomes smaller, as the position of the edge of the magnetic flux concentrator moves farther in the positional relationship with the Hall elements in the horizontal plane (as the radius R increases).

Based on FIGS. 9 to 15 and Table 1, ranges that are practical in use shall now be cited. For example, as practical ranges, the magnetic flux concentrator has a radius R=approximately 96 to 100 to 130 to 150 μm, the vertical separation distance between the Hall elements and the bottom surface of the magnetic flux concentrator=approximately 9 to 10 to 11 to 12 to 20 μm, and its thickness T=approximately 4 to 10 to 16 to 30 μm.

If the distance between the center position of the magnetic detecting surface of each Hall element and the edge of the magnetic flux concentrator is expressed as a ratio with respect to the radius of the magnetic flux concentrator, it is desirable that the center of the magnetic detecting surface of each Hall element be disposed in a region, for example, of 0.58 to 0.92 times in the radius, in terms of reducing variations of the sensitivity or in terms of balancing the ratio of sensitivities of the X-axis and Y-axis and sensitivity of the Z-axis.

Taking into consideration the slight differences of conditions, a "region of 0.55 to 0.95 times in the radius" is used as a guideline.

Depending on signal processing algorithms, like an integrated circuit, executed by subsequent sequences after the magnetic flux concentrator and the Hall elements, the ratio of the sensitivities of the X-axis and Y-axis on magnetic detecting surfaces of the Hall elements and the sensitivity of the Z-axis on magnetic detecting surfaces of the Hall elements may be set to a value other than approximately 1. And, in this case, the position of the center of the magnetic detecting surface of each Hall element is not restricted to being within the above-mentioned "region of 0.55 to 0.95 times in the radius."

If thinking that a case where the ratio of the sensitivities of the X-axis and Y-axis and the sensitivity of the Z-axis on the magnetic detecting surfaces of the Hall elements is approximately 2, for example, where a thickness of the magnetic flux concentrator is approximately 10 μm to approximately 16 μm, and where a radius of the magnetic flux concentrator is approximately 155 to 165 to 175 μm or so. In such case, a center of a magnetic detecting surface of each Hall element is located at a position approximately −5 to −6 μm inward from the edge of the circular magnetic flux concentrator. Each position that is approximately −5 to −6 μm inward from the edge of the circular magnetic flux concentrator is in an extremum region of less sensitivity change.

(On magnetic detecting surfaces of each Hall element, with the ratio of the sensitivities of the X-axis and Y-axis and the sensitivity for the Z-axis, being approximately 1), it was found that with the present case, sensitivity variations and crosstalk (angular errors accompanying signal leakage among different axes) are small, in comparison to a case of a region of 0.55 to 0.95 in a relationship between the radius of magnetic flux concentrator and (the centers of) the magnetic detecting surfaces of each Hall element.

Figure 30:
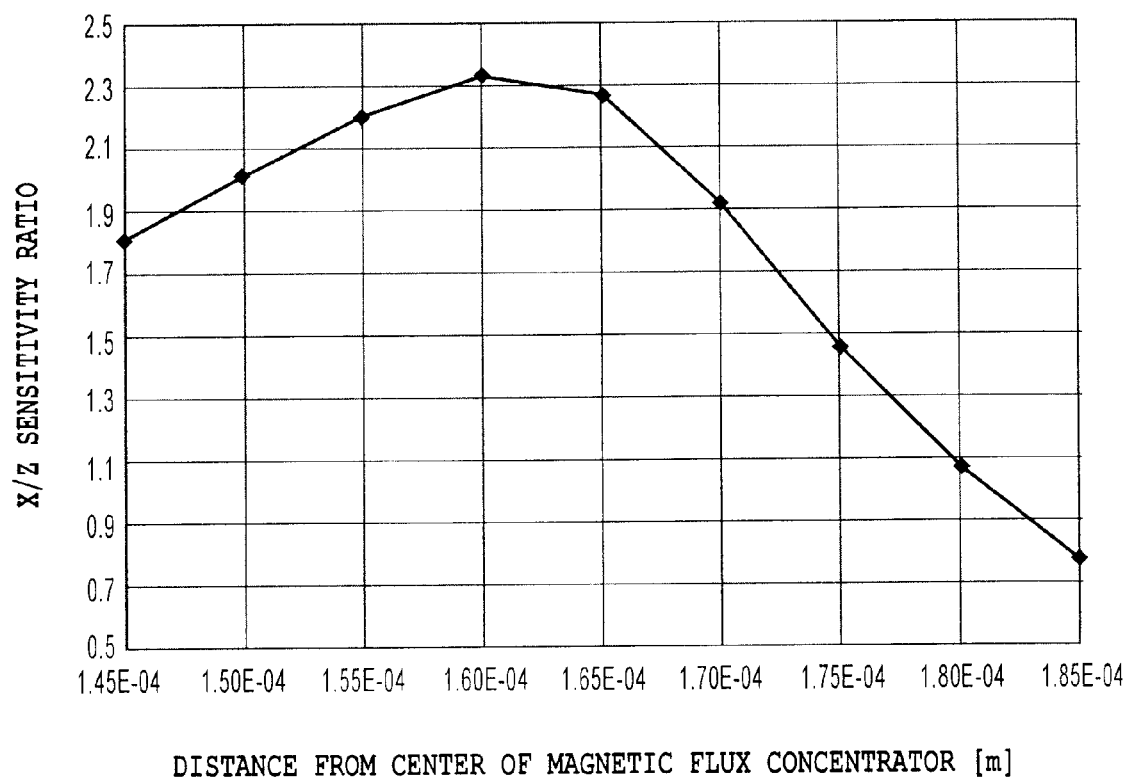
FIG. 30 is a diagram of a numerical analysis example showing an extremum position at which a sensitivity ratio change becomes zero for an arrangement where the magnetic flux concentrator thickness is 12 μm and the magnetic flux concentrator radius is 165 μm.
Figure 31:
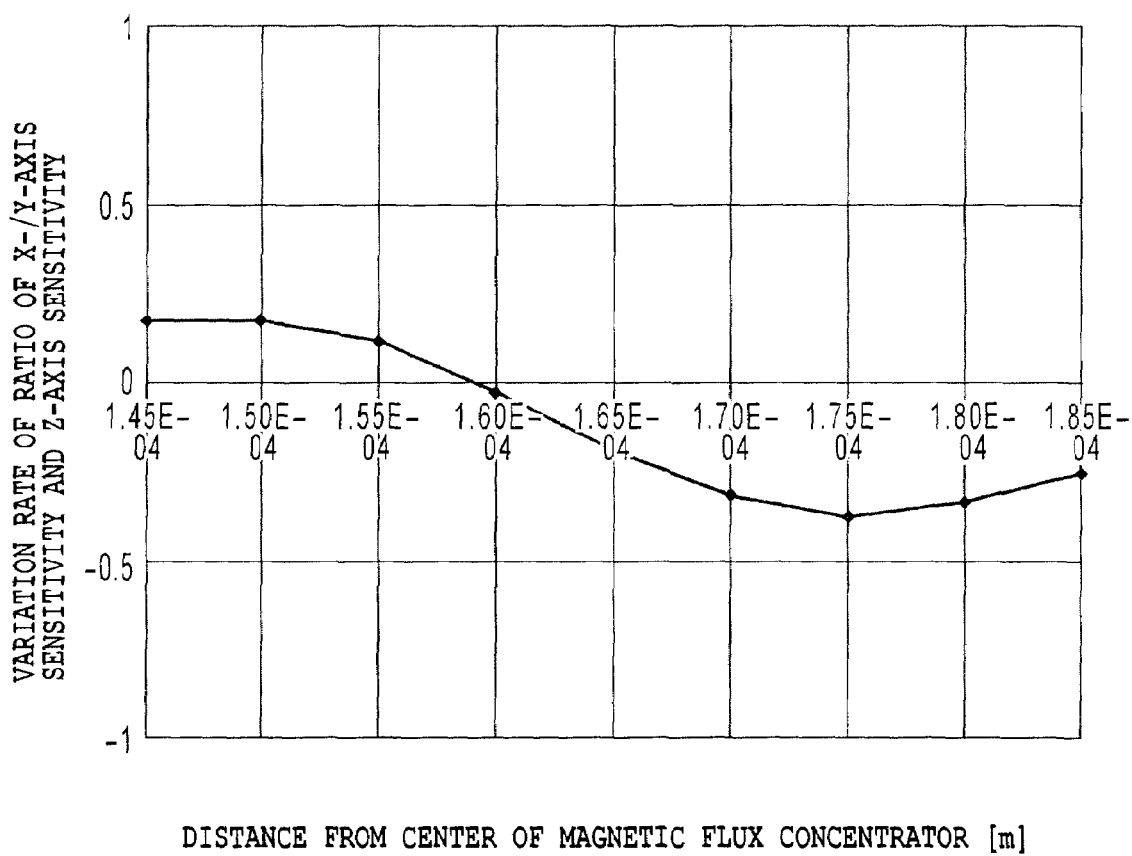
FIG. 31 is a diagram of a numerical analysis example showing a position of zero sensitivity ratio variation rate for the same arrangement as that of FIG. 30.

FIG. 30 is a diagram of a numerical analysis example showing an extremum position at which a sensitivity ratio change becomes zero, in an arrangement where the magnetic flux concentrator thickness is 12 μm and where the magnetic flux concentrator radius is 165 μm. And FIG. 31 is a diagram of a numerical analysis example showing the zero position of variation of sensitivity ratio for the same arrangement.

In regard to crosstalk, with an arrangement where a thickness of the magnetic flux concentrator is 12 μm, where a radius of the magnetic flux concentrator is 115 μm, where the separation distance between the Hall elements and the bottom surface of the magnetic flux concentrator is 10 μm, and where (the center of) the magnetic detecting surface of each Hall element is located at a position (X, Y)=(87, 20)μm. Cross-axial angular error between the X-axis and the Z-axis is determined by numerical calculation to be approximately 1.3 degrees/μm. On the other hand, with an arrangement where a thickness of the magnetic flux concentrator is 12 μm, where a radius of the magnetic flux concentrator is 165 μm, where the separation distance between the Hall elements and the bottom surface of the magnetic flux concentrator is 10 μm, and (the center of) the magnetic detecting surface of each Hall elements is located at a position (X, Y)=(160, 20)μm. Cross-axial angular error between the X-axis and the Z-axis is determined by numerical calculation to be approximately 0.4 degrees/μm.

As seen, (in the case where the ratio of the sensitivities of the X-axis and Y-axis to the sensitivity for the Z-axis on magnetic detecting surfaces of the Hall elements is approximately 2), it can thus be understood that there is a useful region where the sensitivity variation is small and the crosstalk is low. In terms of process, this is realized by suppressing the positional shift of the magnetic flux concentrator to within approximately ±2 to ±3 μm.

With an expression of the position of (the center of) the magnetic detecting surface of each Hall element relative to a radius of the magnetic flux concentrator, in the above-described arrangements, these are approximately 150/155=0.9677 or approximately 160/165=0.9696. And, supposing that the tolerance of a radius of the magnetic flux concentrator is approximately 2 to 3 μm, some of preferable positional relationships between (the center of) the magnetic detecting surface of the Hall element and a radius of the magnetic flux concentrator are shown below. With the position of the magnetic detecting surface of the Hall elements being located at −5 μm in a horizontal direction toward the center from the edge of the magnetic flux concentrator (in the case of the radius of 165 μm, it is a coordinate position of 160 μm along the X-axis direction from a center of the magnetic flux concentrator) and with a distance of 20 μm in the perpendicular direction (at a coordinate position of 20 μm along the Y-axis direction from a center of the magnetic flux concentrator), the ratio of the position of (the center of) the magnetic detecting surface of the Hall elements to a radius of the magnetic flux concentrator is 0.9493 to 0.9883. Or, using an expression of the distance from a center of radius of the magnetic flux concentrator to (the center of) the magnetic detecting surface of the Hall elements, as the distance is expressed by the radial length calculated with the X-coordinate and Y-coordinate positions, the values are shown in Table 2. And the relationships of positions of (the center of) the magnetic detecting surface to a radius of the magnetic flux concentrator is 0.9608 to 0.9923. Thus, it becomes clear that 0.95 to 1 is a useful range as the positional relationship.

TABLE 2

| Case No. | Radial distance [µm] | radius of magnetic flux concentrator [µm] (ratio of) center position of magnetic detecting surface | Minimum radius [µm] (ratio of) center position of magnetic detecting surface | Maximum radius [µm] (ratio of) center position of magnetic detecting surface |
|---|---|---|---|---|
| 1 | 151.33 | 155.00 | 152.50 | 157.50 |
|   |        | 0.9763 | 0.9923 | 0.9608 |
| 2 | 161.25 | 165.00 | 162.50 | 167.50 |
|   |        | 0.9772 | 0.9923 | 0.9627 |
| 3 | 171.17 | 175.00 | 172.50 | 2.50 |
|   |        | 0.9781 | 0.9923 | 0.9644 |

The range of "0.55 to 0.95" is described as being useful in the above table. The range of "0.95 to 1" is also useful as can be seen in the above table; in summary, the range of "0.55 to 1" is one of the most useful range ranges.

<Base Metal Layer>

The difference of coefficient of thermal expansion between the substrate on which the Hall elements are formed and the base metal layer which is formed below the magnetic flux concentrator cause strain and offset voltage. With the present invention, a magnetic sensor with low offset voltage can be formed by design of the structure of the base metal layer.

Figure 16:
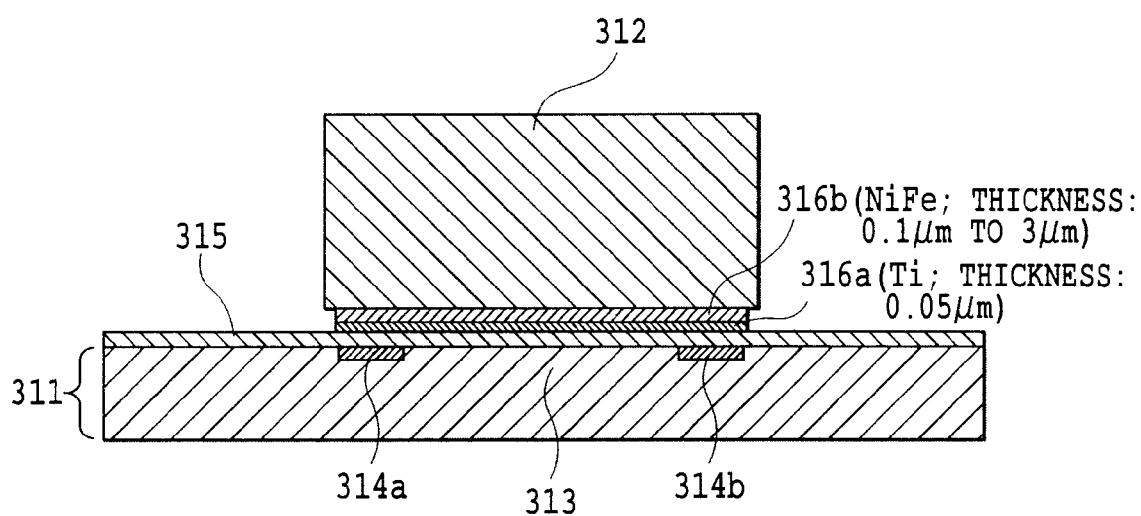
FIG. 16 is an arrangement diagram for describing an embodiment of a magnetic sensor according to the present invention.

FIG. 16 is an arrangement diagram for describing an embodiment of a magnetic sensor according to the present invention in which the base metal layer is modified, and in the figure, the reference numeral 311 indicates a semiconductor circuit, 312 indicates a magnetic flux concentrator (magnetic alloy film), 313 indicates a semiconductor substrate, 314a and 314b indicate Hall elements, 315 indicates a buffer coat layer, 316a indicates a first metal film, and 316b indicates a second metal film.

The magnetic flux concentrator 312 is formed of NiFe and preferably has a film thickness of 5 to 30 µm. The metal film has a two-layer structure, which comprises the first metal film 316a and the second metal film 316b, and the first metal film 316a of the first layer is formed of Ti, W, or a TiW alloy and has a film thickness of preferably 0.01 to 1 µm and optimally 0.05 µm. The second metal film 316b of the second layer is formed of NiFe and has a film thickness of preferably 0.1 to 3 µm.

Figure 17A:
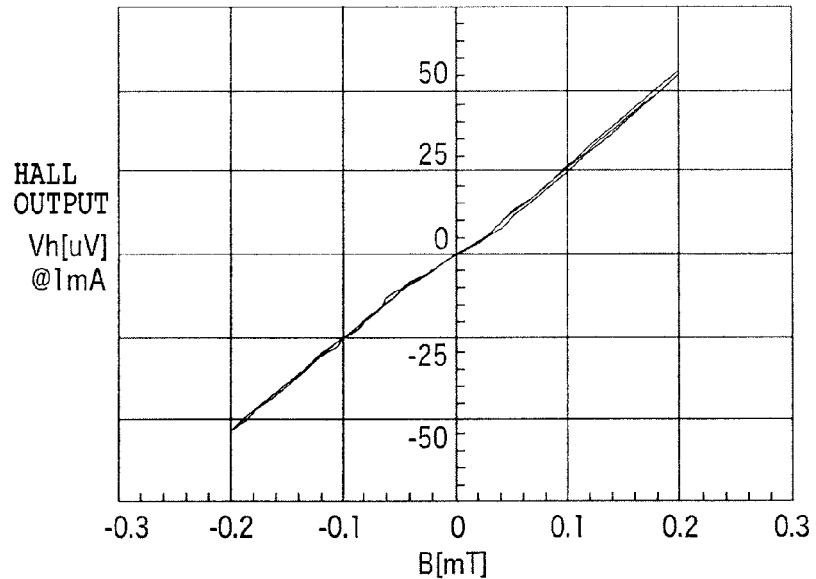
FIG. 17A is a diagram of comparison of magnetic characteristics of Hall elements of the present invention and a conventional example and shows magnetic characteristics of the Hall elements when there is strain in a magnetic substance.
Figure 17B:
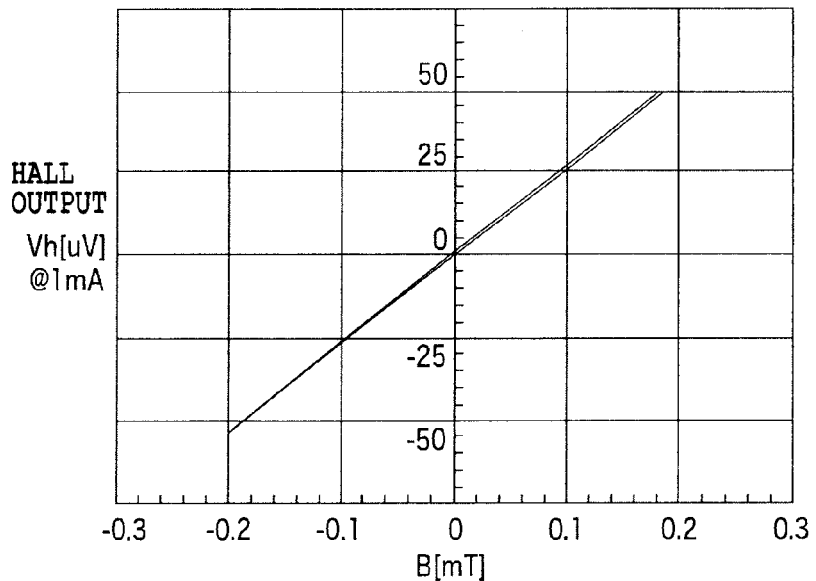
FIG. 17B is a diagram of comparison of the magnetic characteristics of the Hall elements of the present invention and the conventional example and shows the magnetic characteristics of the Hall elements when there is no strain in the magnetic substance.

FIGS. 17A and 17B are diagrams comparing the magnetic characteristics (Hall outputs with respect to magnetic field strength) of the Hall elements of the present invention and a conventional example, with FIG. 17A showing the magnetic characteristics of the Hall elements when there is strain in the magnetic substance, and FIG. 17B showing the magnetic characteristics of the Hall elements when there is no strain in the magnetic substance.

As can be understood from the above, because the metal film is made to have the two-layer structure and the second metal film is made to have the film thickness of 0.1 to 3 µm, magnetic strain due to the coefficient of thermal expansions of the metal film and the magnetic flux concentrator is eliminated and more linear magnetic characteristics are obtained with the magnetic characteristics of the Hall elements without strain in the magnetic substance.

Figure 18A:
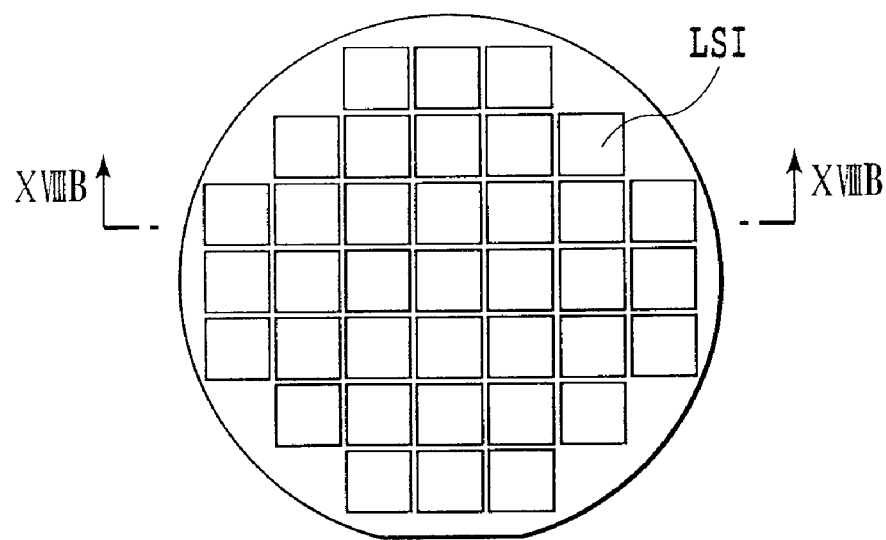
FIG. 18A is a diagram of an IC wafer according to the present invention and shows the IC wafer.
Figure 18B:
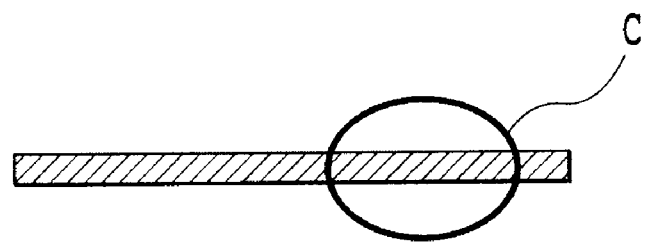
FIG. 18B is a schematic sectional view taken along line XVIIIB-XVIIIB of FIG. 18A.

FIGS. 18A and 18B are diagrams of an IC wafer according to the present invention, with FIG. 18A showing the IC wafer and FIG. 18B showing a schematic sectional view taken along line X XVIIIB-XVIIIB of FIG. 18A. The C region in FIG. 18B indicates a magnetic sensor chip, which is shown in FIG. 19A and shall be described below.

FIGS. 19A to 19F are sectional process diagrams for describing an embodiment of a method for manufacturing the magnetic sensor according to the present invention.

Figure 19A:
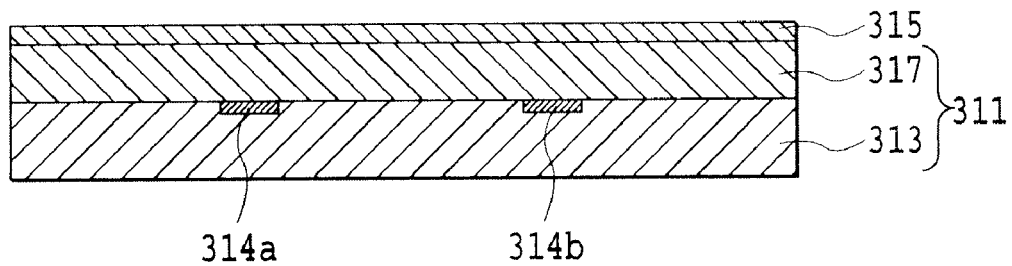
FIG. 19A is a sectional process diagram for describing an embodiment of a method for manufacturing the magnetic sensor according to the present invention.

First, as shown in FIG. 19A, the Hall elements 314a and 314b are embeddedly formed in the semiconductor substrate 313, formed of Si or GaAs, so as to be coplanar to the top surface of the semiconductor substrate 313 while being mutually spaced apart by a predetermined distance, and an IC layer 317 is then formed from SiO2 or SiN, etc., above the semiconductor substrate 313 to form the semiconductor circuit 311 (preparation of a magnetic sensor chip). Polyimide is then patterned above the semiconductor circuit 311 to form the buffer coat layer 315, formed of polyimide, above the semiconductor circuit 311 (polyimide patterning).

Figure 19B:
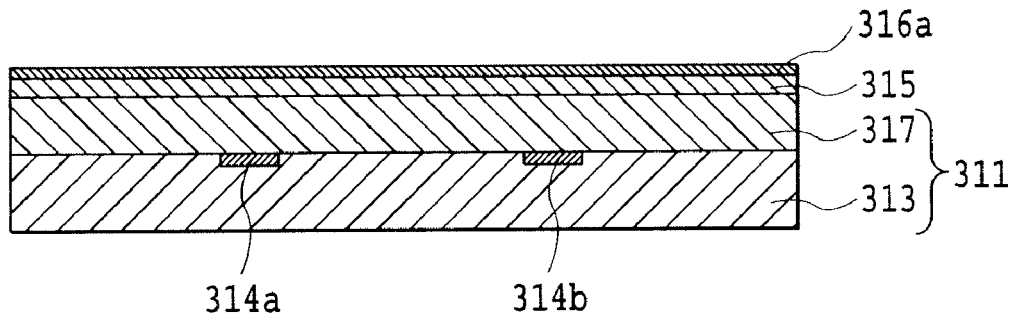
FIG. 19B is a sectional process diagram for describing the embodiment of the method for manufacturing the magnetic sensor according to the present invention.

Next, as shown in FIG. 19B, the first metal film 316a, which comprises Ti, W, or the TiW alloy and has a film thickness of 0.01 to 1 µm, is formed by sputtering or vacuum vapor deposition above the buffer coat layer 315 (forming of a base layer).

Figure 19C:
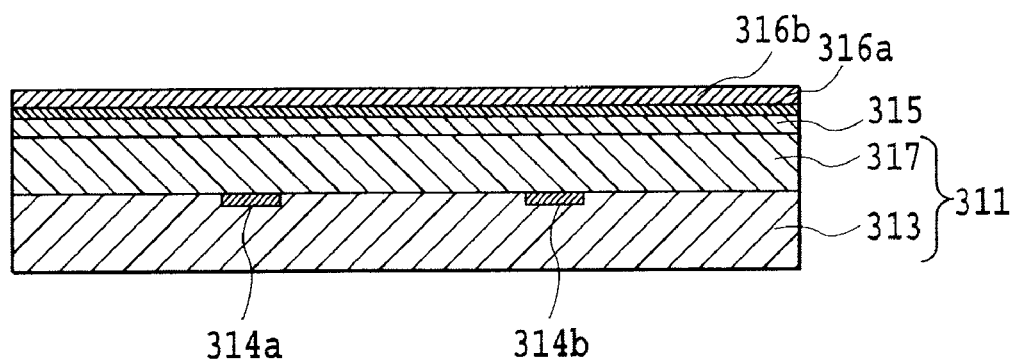
FIG. 19C is a sectional process diagram for describing the embodiment of the method for manufacturing the magnetic sensor according to the present invention.

Next, as shown in FIG. 19C, the second metal film 316b, which comprises NiFe and has a film thickness of 0.1 to 3 µm, is formed by sputtering or vacuum vapor deposition above the first metal film 316a (forming of an intermediate layer).

Figure 19D:
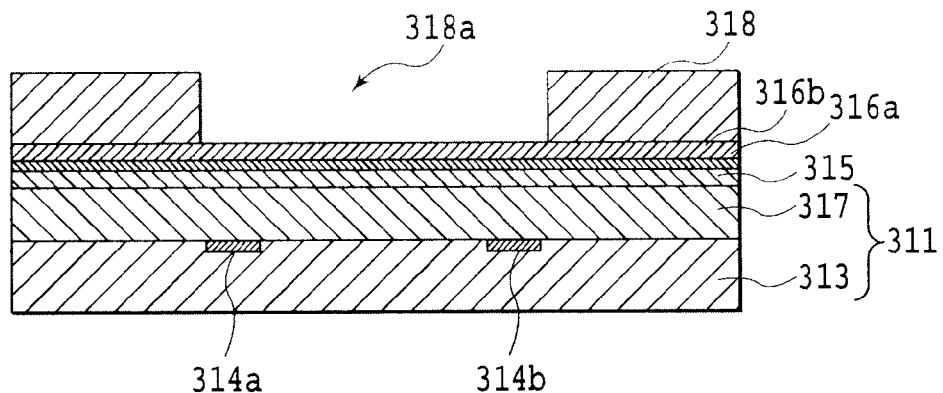
FIG. 19D is a sectional process diagram for describing the embodiment of the method for manufacturing the magnetic sensor according to the present invention.

Next, as shown in FIG. 19D, a resist 318 is formed above the second metal film 316b by performing resist patterning so that a portion above the Hall elements 314a and 314b becomes an opening 318a (forming of a resist pattern).

Figure 19E:
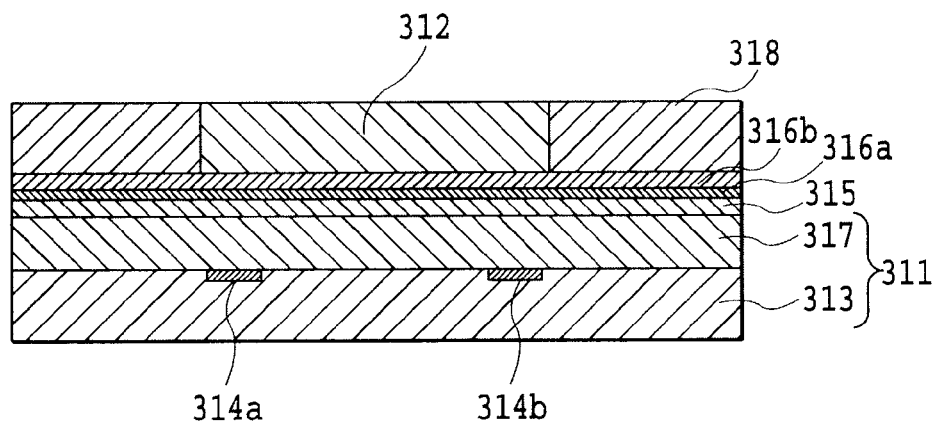
FIG. 19E is a sectional process diagram for describing the embodiment of the method for manufacturing the magnetic sensor according to the present invention.

Next, as shown in FIG. 19E, the magnetic alloy film (magnetic flux concentrator) 312, having the film thickness of 5 to 30 µm and having the magnetic amplification function, is formed by electroplating in the opening 318a above the second metal film 316b (magnetic substance plating process). The magnetic alloy film 312 is formed by preparing an Fe—Ni based alloy by electroplating and preferably comprises a permalloy or super-permalloy (Fe—Ni based alloy) and more preferably comprises such an alloy with Co added because magnetic hysteresis is then reduced. Furthermore, the magnetic alloy film 312 preferably comprises permendur (Fe—Co based alloy) or sendust (Fe—Si—Al based alloy).

Figure 19F:
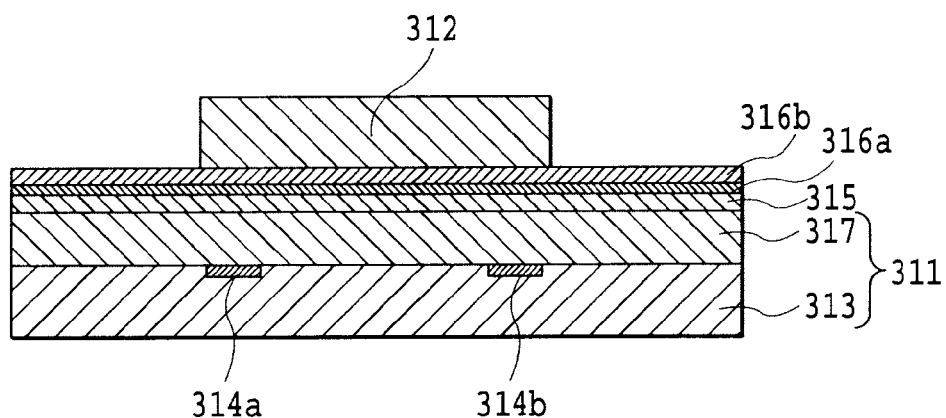
FIG. 19F is a sectional process diagram for describing the embodiment of the method for manufacturing the magnetic sensor according to the present invention.

Next as shown in FIG. 19F, the resist pattern 318 is removed (resist pattern removal). As a result, the magnetic alloy film 312 is left on the second metal film 316b.

Although not illustrated, Cu etching is then performed using NiFe as a mask. In this case, NiFe is not etched and just Cu is etched selectively. The etching solution may be either an alkali-based solution or an acid-based solution (Cu etching). Also, Ti etching is performed using NiFe as a mask. In this case, NiFe is not etched and just Ti is etched selectively. The etching solution may be either an alkali-based solution or an acid-based solution (Ti etching).

Finally, the plural magnetic sensor chips are separated into individual chips by dicing (dicing).

FIG. 20 is a table of relationships of the film thickness of the second metal film and magnetic strain. As is clear from this figure, although magnetic strain remains in cases where the film thickness of the second metal film is set to 0.05 μm and 0.07 μm, magnetic strain does not occur in cases where the film thickness is set in the range of 0.1 to 3 μm.

With the magnetic sensor thus prepared, by providing the metal film that contacts the magnetic flux concentrator with the two-layer structure and making the second metal film have the film thickness of 0.1 to 3 μm to eliminate the occurrence of magnetic strain due to the thermal expansion difference between the Ti, W, or TiW alloy of the metal film and the NiFe of the magnetic flux concentrator that occurs in the conventional arrangement, the magnetic strain resulting from the thermal expansion difference between the first metal film and the magnetic alloy film can be eliminated and an extremely stable magnetic sensor can be realized.

Figure 21:
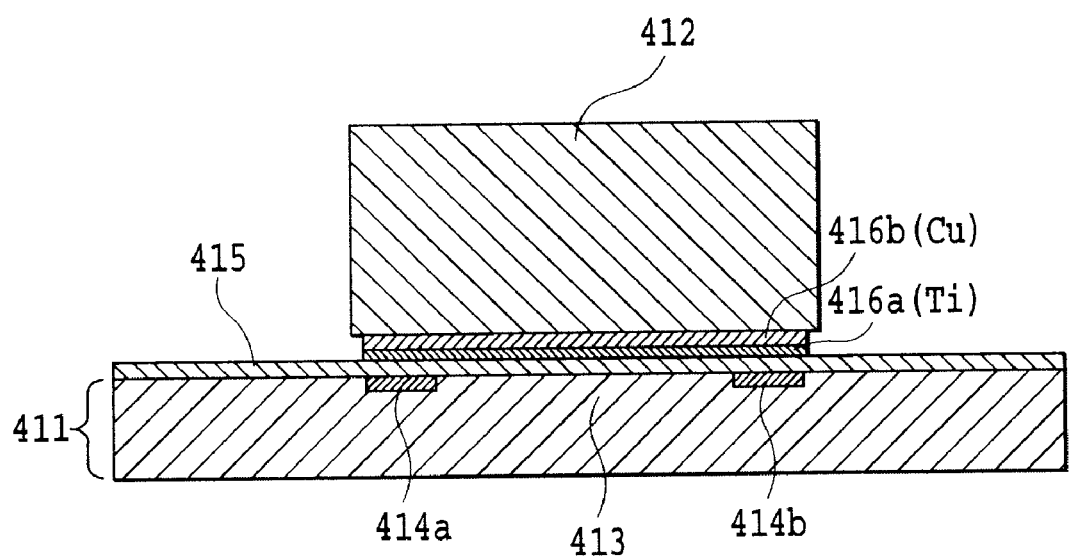
FIG. 21 is an arrangement diagram for describing an embodiment of a magnetic sensor according to the present invention.

FIG. 21 is an arrangement diagram for describing another embodiment of a magnetic sensor according to the present invention with which the base metal layer is modified, and in the figure, the reference numeral 411 indicates a semiconductor circuit, 412 indicates a magnetic flux concentrator (magnetic alloy film), 413 indicates a semiconductor substrate, 414a and 414b indicate Hall elements, 415 indicates a buffer coat film, 416a indicates a first metal film, and 416b indicates a second metal film.

With the magnetic sensor according to the present invention, the semiconductor circuit 411, on which the Hall elements 414a and 414b are formed, is combined with the magnetic flux concentrator 412, which is a magnetic alloy film. The semiconductor circuit 411 comprises the semiconductor substrate 413 and the Hall elements 414a and 414b that are embedded in a top surface of the semiconductor substrate 413 so as to be coplanar to the top surface of the semiconductor substrate 413 while being mutually spaced apart by a predetermined distance.

The buffer coat layer 415 is stacked on the semiconductor circuit 411 so as to be positioned above the Hall elements 414a and 414b, the first metal film 416a is stacked above the buffer coat film 415 and the second metal film 416b is stacked further above. The magnetic flux concentrator 412, having the magnetic amplification function, is stacked above the second metal film 416b.

Figure 22A:
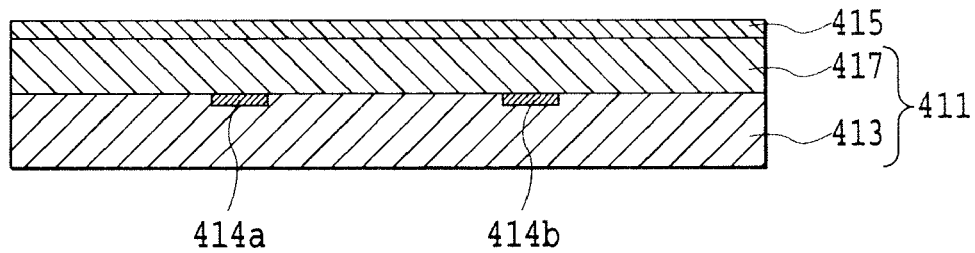
FIG. 22A is a sectional process diagram for describing an embodiment of a method for manufacturing the magnetic sensor according to the present invention.

Although not illustrated in FIG. 21, in actuality, an IC layer is placed between the semiconductor circuit 411 and the buffer coat layer 415 (the IC layer is illustrated in FIG. 22A onward for describing a manufacturing method).

The magnetic flux concentrator 412 is formed of an alloy containing at least two types of metal selected from the group consisting of Ni, Fe, and Co, preferably has a coefficient of thermal expansion of 10 to 15 ppm/° C., and in particular, the coefficient of thermal expansion is optimally 12 ppm/° C. The magnetic flux concentrator 412 preferably has a film thickness of 5 to 30 μm.

The metal film has a two-layer structure, which comprises the first metal film 416a and the second metal film 416b, and the first metal film 416a of the first layer is formed of Ti, W, or a TiW alloy, preferably has a coefficient of thermal expansion of 4 to 10 ppm/° C., and in particular, the coefficient of thermal expansion of Ti is optimally 8 ppm/° C. and the coefficient of thermal expansion of W is optimally 4 ppm/° C. The first metal film 416a of the first layer has a film thickness of preferably 0.01 to 1 μm.

The second metal film 416b of the second layer contains Cu, has a coefficient of thermal expansion of preferably 15 to 20 ppm/° C., and has a film thickness of preferably 0.1 to 2 μm.

Because the metal film is provided with the two-layer structure and the coefficient of thermal expansions of the respective layers are taken into consideration, magnetic strain due to the coefficient of thermal expansions of the metal film and the magnetic flux concentrator is eliminated and more linear magnetic characteristics are obtained with the magnetic characteristics of the Hall elements without strain in the magnetic substance.

FIGS. 22A to 22F are sectional process diagrams for describing an embodiment of a method for manufacturing the magnetic sensor according to the present invention.

First, as shown in FIG. 22A, the Hall elements 414a and 414b are embeddedly formed on the semiconductor substrate 413, formed of Si or GaAs, so as to be coplanar to the top surface of the semiconductor substrate 413 while being mutually spaced apart by a predetermined distance. An IC layer 417 is then formed from SiO2 or SiN, etc., above the semiconductor substrate 413 to form the semiconductor circuit 411 (preparation of a magnetic sensor chip). Polyimide is then patterned above the semiconductor circuit 411 to form the buffer coat layer 415, formed of polyimide, on the semiconductor circuit 411 (polyimide patterning). The forming of the buffer coat layer 415 may be omitted.

Figure 22B:
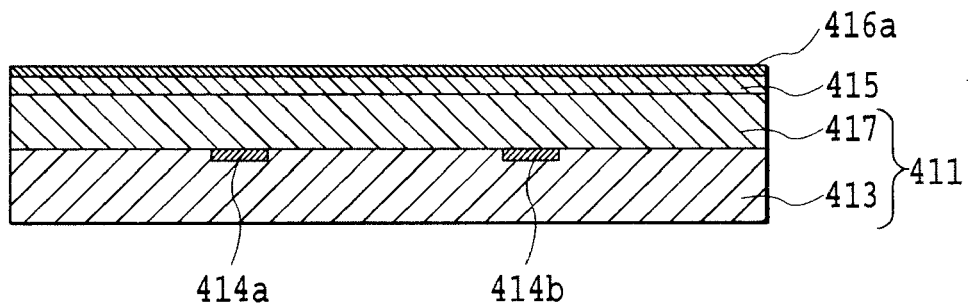
FIG. 22B is a sectional process diagram for describing the embodiment of the method for manufacturing the magnetic sensor according to the present invention.

Next, as shown in FIG. 22B, the first metal film 416a, which comprises Ti, W, or the TiW alloy and has a film thickness of 0.01 to 1 μm, is formed by sputtering or vacuum vapor deposition on the buffer coat layer 415 (forming of a base layer). As mentioned above, the first metal film 416a preferably has a coefficient of thermal expansion of 4 to 10 ppm/° C., and in particular, the coefficient of thermal expansion of Ti is optimally 8 ppm/° C. and the coefficient of thermal expansion of W is optimally 4 ppm/° C.

Figure 22C:
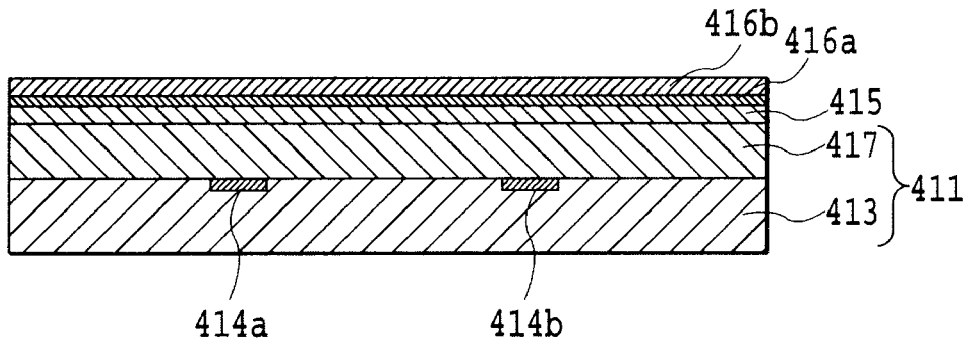
FIG. 22C is a sectional process diagram for describing the embodiment of the method for manufacturing the magnetic sensor according to the present invention.

Next, as shown in FIG. 22C, the second metal film 416b, containing Cu and having the film thickness of 0.1 to 2 μm, is formed by sputtering or vacuum vapor deposition on the first metal film 416a (forming of an intermediate layer). As mentioned above, the second metal film 416b preferably has a coefficient of thermal expansion of 15 to 20 ppm/° C.

Figure 22D:
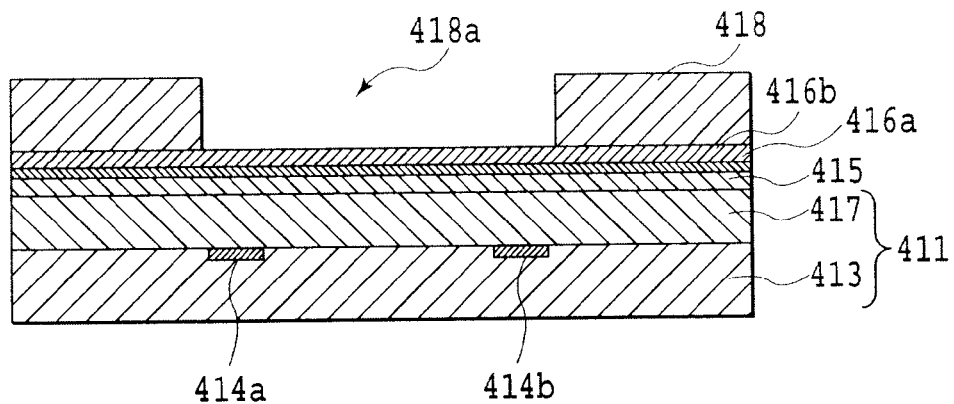
FIG. 22D is a sectional process diagram for describing the embodiment of the method for manufacturing the magnetic sensor according to the present invention.

Next, as shown in FIG. 22D, a resist 418 is formed above the second metal film 416b by performing resist patterning so that a portion above the Hall elements 414a and 414b becomes an opening 418a (forming of a resist pattern).

Figure 22E:
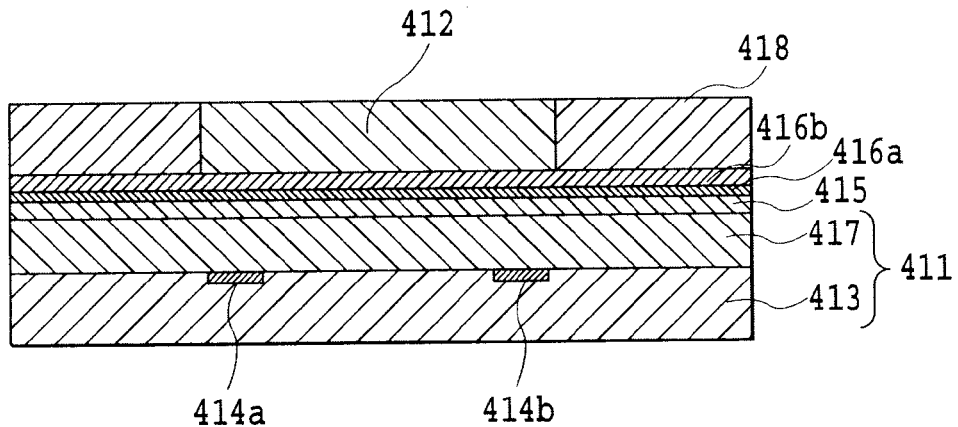
FIG. 22E is a sectional process diagram for describing the embodiment of the method for manufacturing the magnetic sensor according to the present invention.

Next, as shown in FIG. 22E, the magnetic alloy film (magnetic flux concentrator) 412, having a film thickness of 5 to 30 μm and having the magnetic amplification function, is formed by electroplating in the opening 418a above the second metal film 416b (magnetic substance plating process). The magnetic alloy film 412 is formed by preparing an Fe—Ni based alloy by electroplating and preferably comprises a permalloy or super-permalloy (Fe—Ni based alloy) and more preferably comprises such an alloy with Co added because magnetic hysteresis is then reduced. Furthermore, the magnetic alloy film 412 preferably comprises permendur (Fe—Co based alloy) or sendust (Fe—Si—Al based alloy).

Figure 22F:
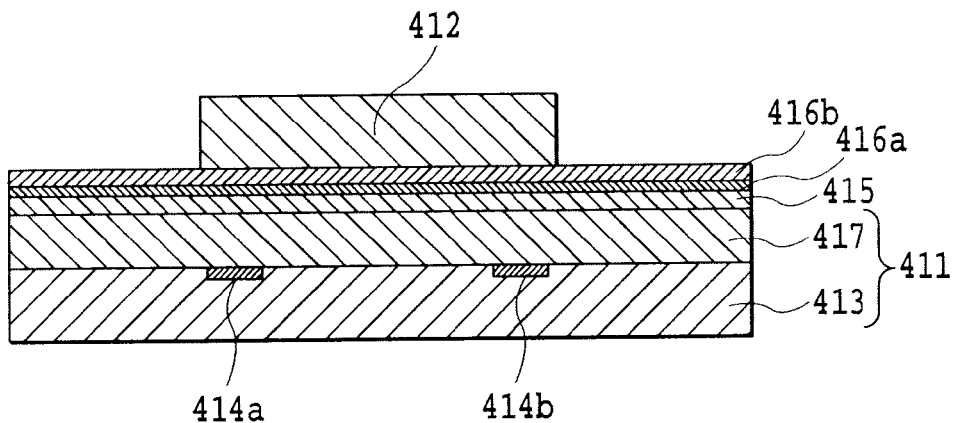
FIG. 22F is a sectional process diagram for describing the embodiment of the method for manufacturing the magnetic sensor according to the present invention.

Next as shown in FIG. 22F, the resist pattern 418 is removed (resist pattern removal). As a result, the magnetic alloy film 412 is left on the second metal film 416b.

Although not illustrated, Cu etching is then performed using NiFe as a mask. In this case, NiFe is not etched, but Cu is etched selectively. The etching solution may be either an alkali-based solution or an acid-based solution (Cu etching). Also, Ti etching is performed using NiFe as a mask. In this case, NiFe is not etched, but Ti is etched selectively. The etching solution may be either an alkali-based solution or an acid-based solution (Ti etching).

Finally, the plural magnetic sensor chips are separated into individual chips by dicing (dicing).

FIG. 23 is a table of relationships of magnetic strain and coefficient of thermal expansion of the magnetic alloy film. FIG. 23 shows the coefficient of thermal expansions and Hall element magnetic characteristics when the alloy ratio of TiW is varied from 100% to 0% (with 100% being a state of pure W and 0% being a state of pure Ti). From FIG. 23, it can be understood that there is no magnetic strain when the coefficient of thermal expansion of the magnetic alloy film is 10 to 15 ppm/° C.

With the magnetic sensor thus prepared, by providing the metal film, contacting the magnetic flux concentrator, with the two-layer structure and adjusting the coefficient of thermal expansion of the metal film to make the coefficient of thermal expansion at the interface with the magnetic flux concentrator match that of the magnetic flux concentrator to eliminate the occurrence of magnetic strain due to the thermal expansion difference between the Ti, W, or TiW alloy of the metal film and the NiFe of the magnetic flux concentrator, a magnetic sensor with extremely stable magnetic characteristics can be provided.

<Shape of Side Surface of the Magnetic Substance>

Figure 24A:
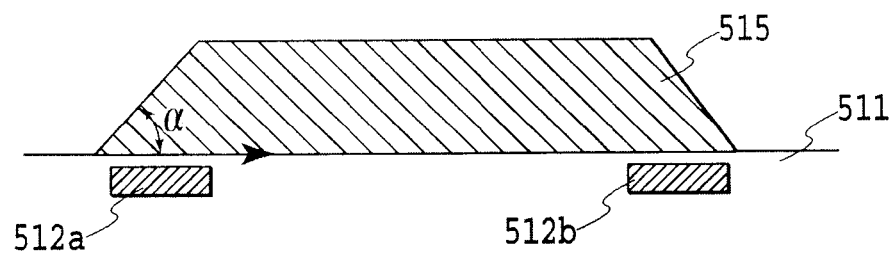
FIG. 24A is an arrangement diagram for describing an embodiment of a magnetic sensor according to the present invention and shows an embodiment where a side surface of a magnetic flux concentrator is made to have a forward tapered shape.
Figure 24B:
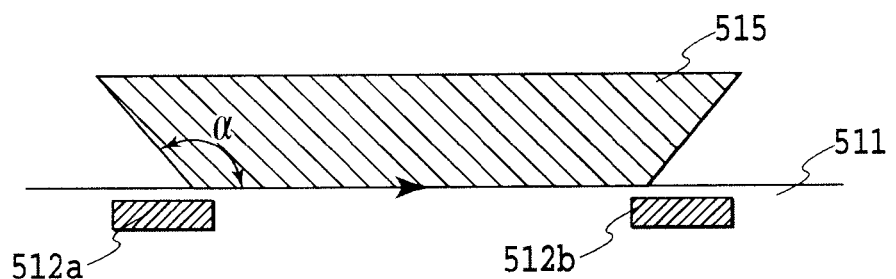
FIG. 24B is an arrangement diagram for describing an embodiment of a magnetic sensor according to the present invention and shows an embodiment where a side surface of a magnetic flux concentrator is made to have an inverted tapered shape.

FIGS. 24A and 24B are arrangement diagrams for describing other embodiments of a magnetic sensor according to the present invention, with FIG. 24A showing an embodiment where a side surface of a magnetic flux concentrator is made to have a forward tapered shape, and FIG. 24B showing an embodiment where a side surface of a magnetic flux concentrator is made to have an inverted tapered shape. In the figures, 511 indicates a semiconductor substrate, 512*a* and 512*b* indicate Hall elements, and 515 indicates a magnetic flux concentrator.

A bottom surface of the magnetic flux concentrator 515 is positioned so as to cover a region of the Hall elements 512*a* and 512*b* at least partially, and a side surface of the magnetic flux concentrator 515 has a forward tapered shape or an inverted tapered shape.

That is, as shown in FIG. 24A, the magnetic flux concentrator 515 has the forward tapered shape, with which an inner taper angle α between a top surface of the semiconductor substrate 511 and the side surface of the magnetic flux concentrator 515 is an acute angle. Or, as shown in FIG. 24B, the magnetic flux concentrator 515 has the inverted tapered shape, with which the inner taper angle α between the top surface of the semiconductor substrate 511 and the side surface of the magnetic flux concentrator 515 is an obtuse angle. The inverted taper angle α is preferably such that $90°<\alpha \leq 120°$.

With the forward tapered shape, because the side surface of the acute-angled magnetic flux concentrator is positioned very close to the Hall elements, the magnetic flux concentrates readily at the acute-angled portion and the sensitivity can thereby be improved. Meanwhile, with the inverted tapered shape, because an end surface of the obtuse-angled magnetic flux concentrator is positioned very close to the Hall elements, saturation of the magnetic flux concentrator becomes less likely to occur near the Hall elements, and consequently, securing of linearity is facilitated without degrading of sensitivity.

The embodiment, shown in FIG. 24A, with which the side surface of the magnetic flux concentrator is made to have the forward tapered shape, and the embodiment, shown in FIG. 24B, with which the side surface of the magnetic flux concentrator is made to have the inverted tapered shape, shall now be compared and their characteristics shall be described.

Figure 25A:
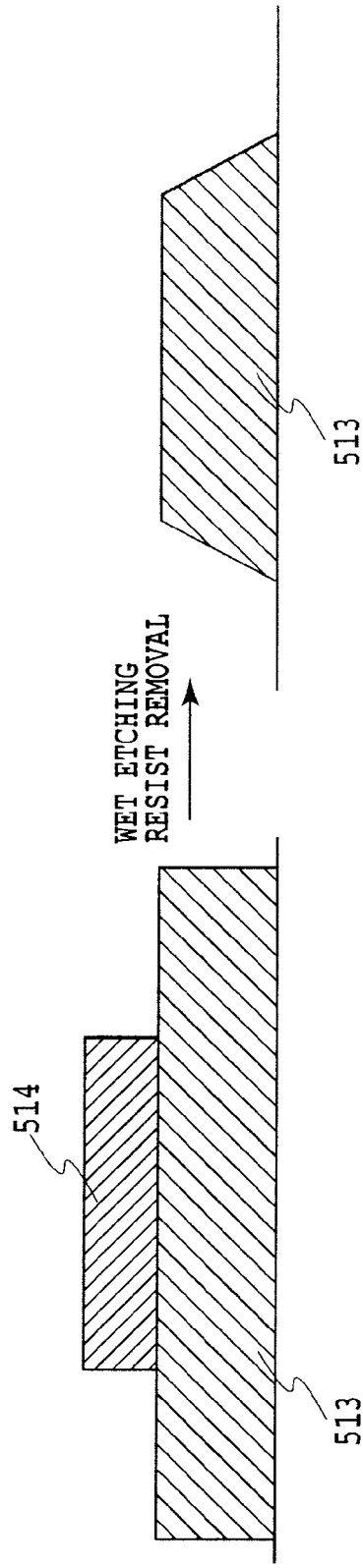
FIG. 25A is a diagram for describing a method for making the side surface of the magnetic flux concentrator have a forward tapered shape or an inverted tapered shape and shows a method for preparing a forward tapered shape.
Figure 25B:
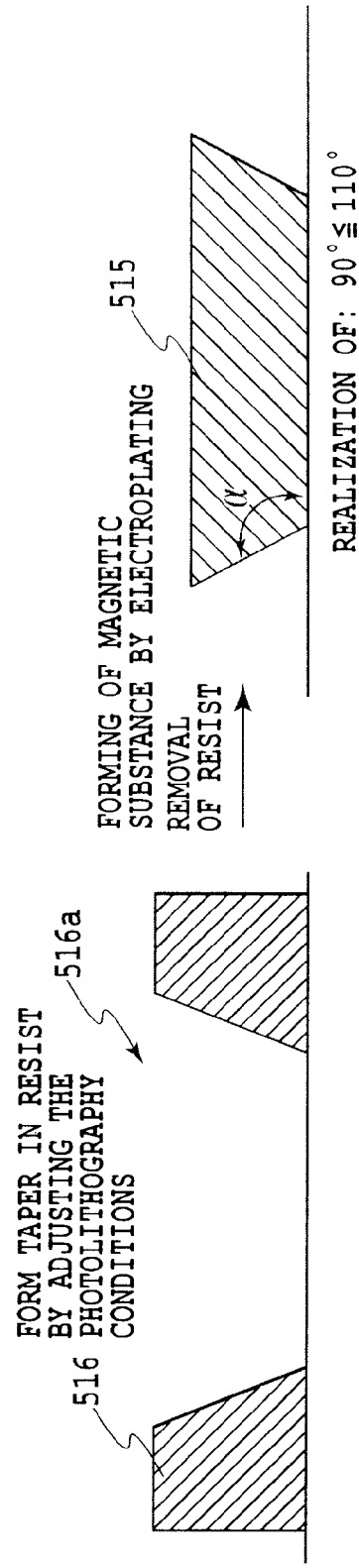
FIG. 25B is a diagram for describing a method for making the side surface of the magnetic flux concentrator have a forward tapered shape or an inverted tapered shape and shows a method for preparing an inverted tapered shape.

FIGS. 25A and 25B are diagrams for describing a method for manufacturing a side surface of a magnetic flux concentrator having a forward tapered shape or an inverted tapered shape, with FIG. 25A showing a method for preparing the forward tapered shape and FIG. 25B showing a method for preparing the inverted tapered shape.

In FIG. 25A, a resist 514 is formed on a magnetic substance 513, formed above Hall elements formed by a semiconductor process, and using the resist 514 as a mask, the magnetic flux concentrator is wet etched and then the resist 514 is removed. By thus wet etching the magnetic substance 513, the forward tapered shape is formed at the side surface of the magnetic substance 513.

Figure 26A:
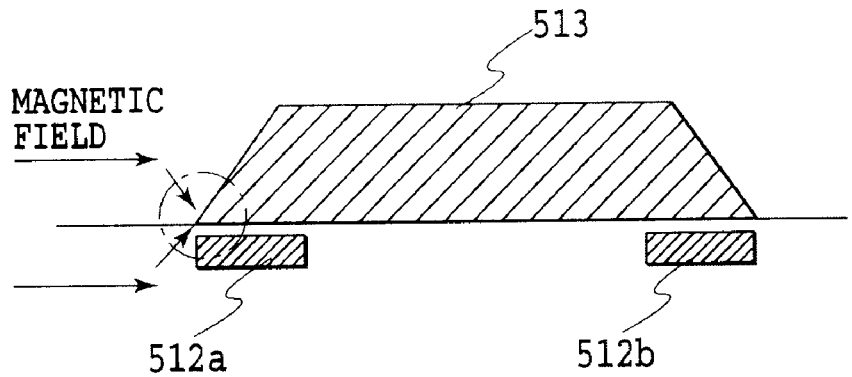
FIG. 26A is a diagram of characteristics of a tapered shape and shows a forward tapered shape.

With the forward tapered shape, although the magnetic flux concentrates readily at the acute-angled portion as shown in FIG. 26A and, in regard to the magnetic amplification function, this is advantageous over the conventional magnetic flux concentrator with the perpendicular side surface in improving the sensitivity, when the magnetic flux concentrates excessively, magnetic saturation occurs and thus depending on the degree of acuteness, the linearity degrades.

Figure 26B:
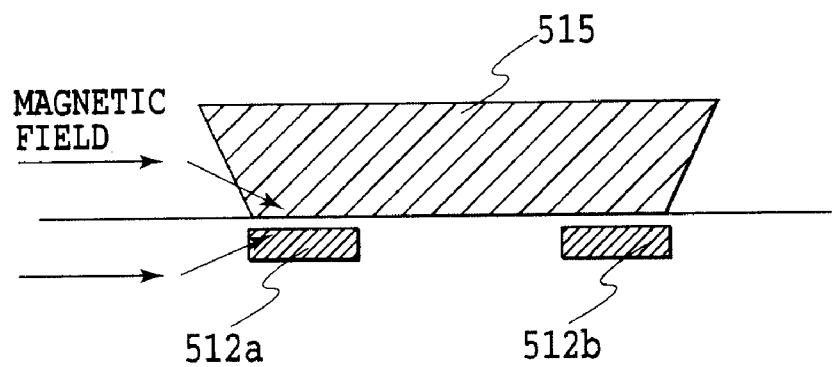
FIG. 26B is a diagram of characteristics of a tapered shape and shows an inverted tapered shape.

Meanwhile, in FIG. 25B, the magnetic flux concentrator is formed by electroplating above the Hall elements formed by the semiconductor process and photolithography conditions are adjusted to prepare the magnetic flux concentrator 515 with the inverted tapered shape. A taper is formed at a side surface of the resist 516 by adjusting the photolithography conditions so that a portion above the Hall elements becomes an opening 516*a* with an inverted tapered shape and thereafter, the magnetic flux concentrator 515, having the magnetic amplification function, is formed by electroplating in the opening 516*a* and the resist 516 is then removed. The inverted tapered shape is thus formed at the side surface of the magnetic flux concentrator 515. In this case, the inner taper angle α between the surface of the semiconductor substrate and the side surface of the magnetic flux concentrator is preferably such that $90°<\alpha \leq 120°$. That is, as shown in FIG. 26B, with the inverted tapered shape, by making the taper angle an obtuse angle, the concentrating of the magnetic flux is relaxed to make magnetic saturation less likely to occur and the linearity can thus be improved without lowering the sensitivity.

By thus providing a forward tapered shape or an inverted tapered shape at the side surface of the magnetic flux concentrator 515, distinct characteristics are provided respectively in comparison to conventional arrangements with perpendicular shapes. By providing the forward tapered shape, the magnetic flux becomes readily concentrated at end portions of the magnetic flux concentrator and consequently, the sensitivity improves. As another effect, when a buffer coat layer of polyimide is formed above the magnetic flux concentrator to relax package stress, by providing a forward tapered shape, improvement can be anticipated in regard to inadequate coverage at the acute angle portion. In this case, a degree of acuteness such that magnetic saturation does not occur within a range of use of the sensor is required. Meanwhile, when an inverted tapered shape is provided, because concentrating of the magnetic flux can be relaxed, the effect of improved linearity is provided. Selection can thus be made as suited according to the purpose of use and the usage method of the magnetic sensor is improved significantly. Conventionally, the angle between the side surface of the magnetic flux concentrator and the surface of the semiconductor substrate is substantially 90°, and there are no ideas of providing a tapered shape as in the present invention. The high usage value of the magnetic flux concentrator according to the present invention can be understood from this point as well.

In the above, the characteristics of providing the side surface of the magnetic flux concentrator with the forward tapered shape and the inverted tapered shape were described based on FIGS. 25A, 25B, 26A, and 26B, and the linearity in the case of the inverted tapered shape shall now be described further in particular.

Figure 27:
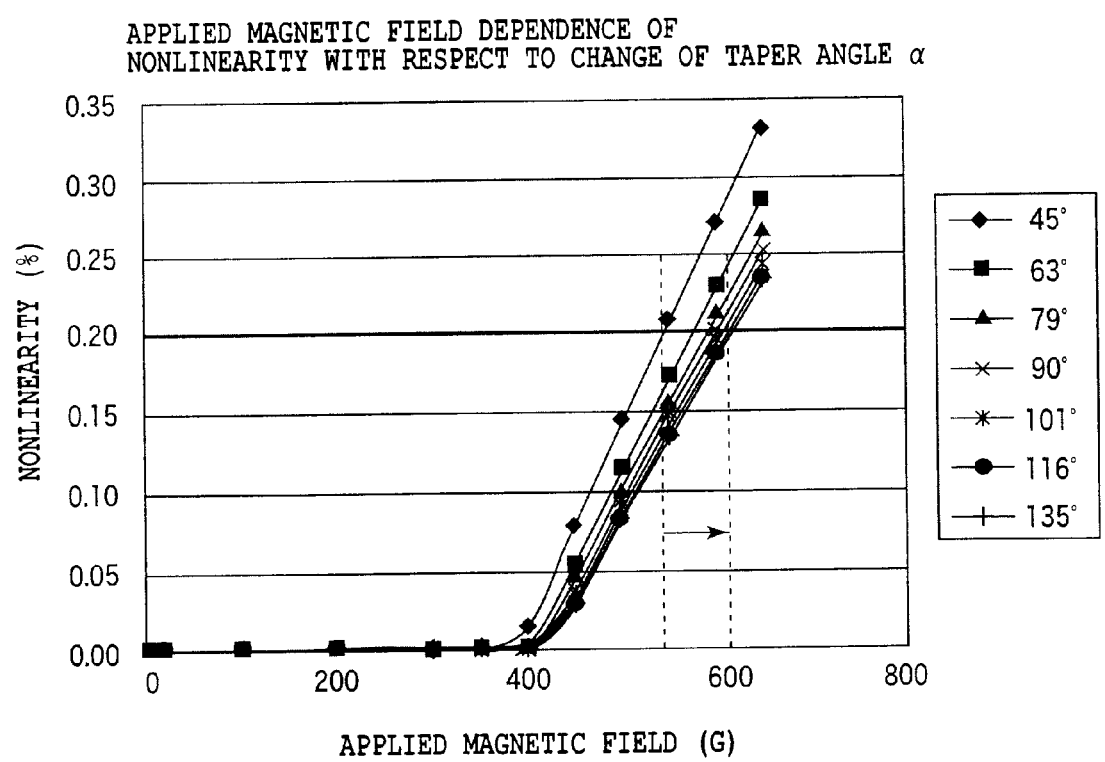
FIG. 27 is a diagram of an applied magnetic field dependence of nonlinearity with respect to change of a taper angle α.

FIG. 27 is a diagram of an applied magnetic field dependence of nonlinearity with respect to change of the taper angle α. If a nonlinearity specification is 0.2%, it can be understood that a range of the magnetic field that can be applied is widened (the range is expanded) by providing an inverted tapered shape.

Figure 28:
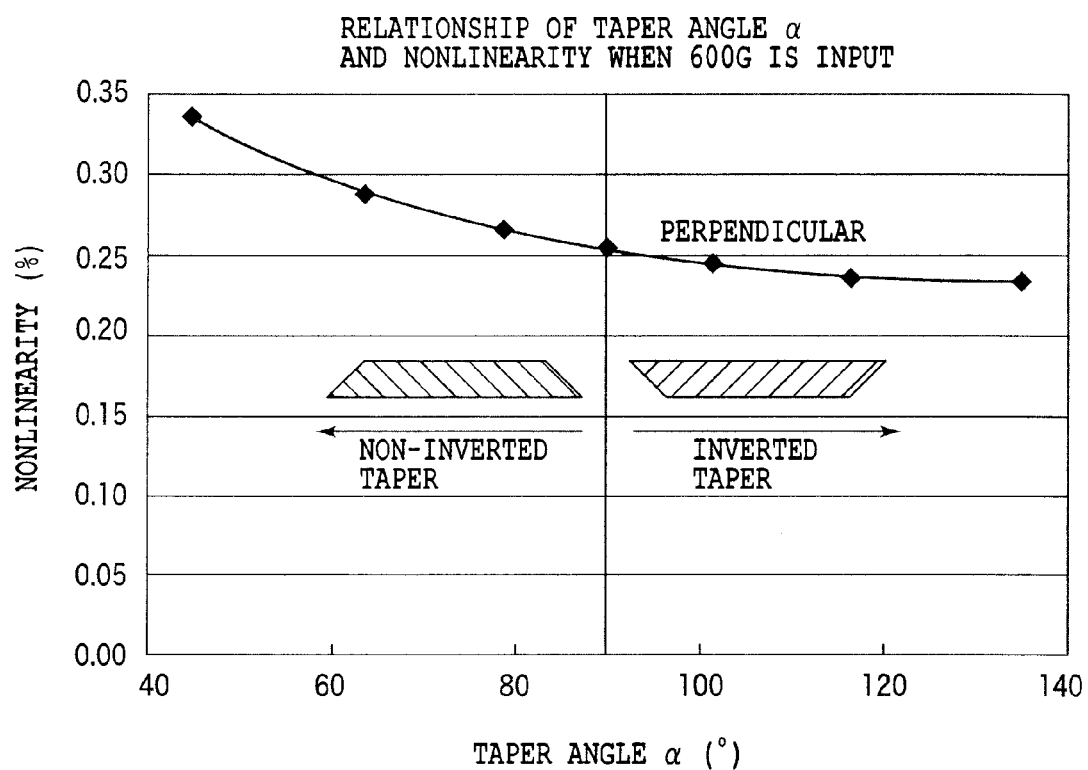
FIG. 28 is a diagram of a relationship of the taper angle α and nonlinearity when an applied magnetic field of 600G is input.
Figure 29:
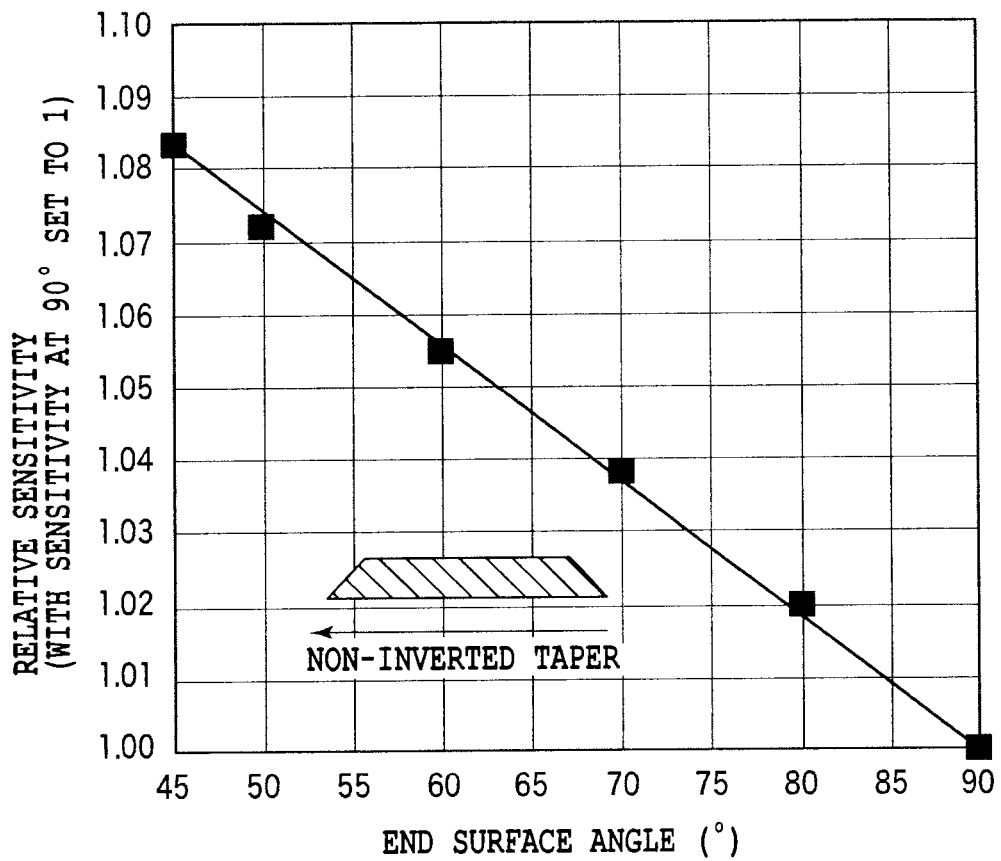
FIG. 29 is a diagram of a relationship of magnetic sensitivity and the taper angle α.

FIG. 28 is a diagram of a relationship of the taper angle α and nonlinearity when an applied magnetic field of 600G is input. From FIG. 28, it can be understood that a more stable linearity is obtained with an inverted tapered shape. FIG. 29 is a diagram of a relationship of magnetic sensitivity and the taper angle α. From FIG. 29, it can be understood that the sensitivity is improved with a forward tapered shape.

An embodiment of a method for manufacturing a magnetic sensor (with an inverted tapered shape) according to the present invention shall now be described.

First, Hall elements 512a and 512b are embeddedly formed in the semiconductor substrate 511, formed of Si or GaAs, so as to be coplanar to the top surface of the semiconductor substrate 511 while being mutually spaced apart by a predetermined distance (preparation of a magnetic sensor chip).

A base metal layer for electroplating is then formed on the Hall elements by sputtering or vacuum vapor deposition (forming of a base metal layer).

Next, as shown in FIG. 25B, the resist 516 is formed by resist patterning on the base metal layer so that the portion above the Hall elements 512a and 512b becomes the opening 516a with the inverted tapered shape (forming of a resist pattern).

The magnetic flux concentrator 515, having the magnetic amplification function, is then formed into the inverted tapered shape by electroplating in the opening 516a above the base metal layer so that a bottom surface of the magnetic flux concentrator 515 covers the region of the Hall elements 512a and 512b at least partially (magnetic substance plating process).

Here, the magnetic flux concentrator 515 is formed by photolithography to provide it with the inverted tapered shape, with which the inner taper angle α between the top surface of the semiconductor substrate 511 and the side surface of the magnetic flux concentrator 515 is an obtuse angle.

The magnetic focusing film 515 is formed by preparing an Fe—Ni based alloy by electroplating and preferably comprises a permalloy or super-permalloy (Fe—Ni based alloy) and more preferably comprises such an alloy with Co added because magnetic hysteresis is then reduced. Furthermore, the magnetic focusing film 515 preferably comprises permendur (Fe—Co based alloy) or sendust (Fe—Si—Al based alloy).

The resist pattern 516 is then removed (resist pattern removal). As a result, the magnetic flux concentrator 515 is left above the base metal layer.

Finally, the plural magnetic sensor chips are separated into individual chips by dicing (dicing).

Although a case of preparing an inverted tapered shape is described above, a forward tapered shape can obviously be prepared by the same steps.

Because the bottom surface of the magnetic flux concentrator is thus positioned to cover the region of each Hall element at least partially and the side surface of the magnetic focusing is made to have the tapered shape, improved sensitivity or improved linearity can be realized by making the side surface of the magnetic substance have the tapered shape in consideration of the degree of concentration of magnetic flux onto the magnetic substance and in consideration of the magnetic saturation.

INDUSTRIAL APPLICABILITY

The present invention relates to a magnetic sensor including a plurality of Hall elements and a magnetic substance having a magnetic amplification function, which is enabled to detect magnetism in two-dimensional or three-dimensional directions, and a method for manufacturing the magnetic sensor. In particular, the present invention provides a magnetic sensor with extremely stable magnetic characteristics and low offset voltage by consideration of the contact area between the base layer of the magnetic substance and the semiconductor substrate, and a method for manufacturing such a magnetic sensor. Also, the magnetic flux concentrator is formed above a polyimide layer, and does not use a conventionally epoxy adhesive. Therefore, the warp of the wafer due to the epoxy adhesive is out of consideration during processing.

The invention claimed is:

1. A magnetic sensor comprising: a semiconductor substrate with a plurality of Hall elements; a magnetic substance with magnetic amplification formed on said semiconductor substrate; a base layer being a base of said magnetic substance, said layer formed on a surface of the semiconductor substrate; and
    wherein said base layer has coefficient of thermal expansion differing from that of the Hall elements and partially covers a region of each Hall element, and said magnetic substance has a cross-sectional area parallel to said surface of the semiconductor substrate larger than the cross-sectional area of said base layer.

2. The magnetic sensor according to claim 1, wherein the magnetic substance and the base layer are circular.

3. The magnetic sensor according to claim 2, wherein a center of a magnetic detecting face of each Hall element is positioned in a region of 0.58 to 0.99 times a radial distance from a center of the magnetic substance.

4. The magnetic sensor according to claim 3, wherein a distance from an upper surface of each Hall element to a lower surface of the magnetic substance is 9 to 20 μm.

5. The magnetic sensor according to claim 1, wherein the magnetic substance and the base layer are polygonal.

6. The magnetic sensor according to claim 1, wherein the base layer is a resin.

7. The magnetic sensor according to claim 1, wherein the base layer is a metal.

8. The magnetic sensor according to claim 1, wherein the thickness of said magnetic substance is 1 μm or more and less than 15 μm.

9. The magnetic sensor according to claim 8, wherein the thickness of said magnetic substance is 5 μm or more and 14 μm or less.

10. The magnetic sensor according to claim 1, wherein the magnetic substance is formed by electroplating.

11. The magnetic sensor according to claim 1, wherein the base layer comprises a first metal layer composed of Ti, W, or a TiW alloy and formed on the semiconductor substrate, and a second metal layer containing Cu formed on the first metal layer.

12. The magnetic sensor according to claim 11, wherein the thickness of the second metal layer is 0.1 to 2 µm.

13. The magnetic sensor according to claim 11, wherein the second metal layer has coefficient of thermal expansion of 15 to 20 ppm/° C.

14. The magnetic sensor according to claim 11, wherein the magnetic substance is composed of an alloy containing at least two types of metal selected from the group consisting of Ni, Fe, and Co, and has coefficient of thermal expansion of 10 to 15 ppm/° C.

15. The magnetic sensor according to claim 14, wherein a buffer coat polyimide layer is formed between the semiconductor substrate and first metal layer.

16. The magnetic sensor according to claim 1, wherein the base layer comprises a first metal layer composed of Ti, W, or a TiW alloy and formed on the semiconductor substrate, and the magnetic substance comprises a second metal layer composed of NiFe with a thickness of 0.1 to 3 µm by sputtering or vacuum vapor deposition on the first metal layer and a magnetic alloy layer composed of NiFe and formed on the second metal layer and formed by electroplating.

17. The magnetic sensor according to claim 16, wherein the thickness of the first metal layer is 0.01 to 1 µm.

18. The magnetic sensor according to claim 16, wherein a buffer coat layer is formed between the semiconductor substrate and the first metal layer.

19. The magnetic sensor according to claim 1, wherein the lower surface of the magnetic substance partially covers the region of each Hall element and a side of the magnetic substance has a tapered shape.

20. The magnetic sensor according to claim 19, wherein the magnetic substance has an inverted tapered shape with which an inner taper angle α between a surface of the semiconductor substrate and the side of the magnetic substance is an obtuse angle.

21. The magnetic sensor according to claim 20, wherein the taper angle α is $90° < α \leq 120°$.

22. The magnetic sensor according to claim 19, wherein the magnetic substance has a forward tapered shape with which the inner taper angle α between the top of the semiconductor substrate and the side of the magnetic substance is an acute angle.

23. A method for manufacturing a magnetic sensor having a semiconductor substrate with plural Hall elements, and a magnetic substance having a magnetic amplification function formed on the semiconductor substrate, the method comprising the steps of:
embedded forming the Hall elements under the top surface of the semiconductor substrate;
forming a buffer coat layer over the Hall elements;
forming a base layer having coefficient of thermal expansion differing from that of the Hall elements, said base layer partially covers a region of each Hall element on the buffer coat layer; and
forming a magnetic substance on the base layer, said magnetic substance having a cross-sectional area parallel to said top surface of the substrate larger than the cross-sectional area of the base layer.

24. The magnetic sensor manufacturing method according to claim 23, wherein the step of forming the base layer and the step of forming the magnetic substance include the steps of: forming a base metal layer for electroplating on the buffer coat layer; forming a resist on the base metal layer by photolithography so that an opening is formed at peripheries of top of the Hall elements; and forming the magnetic substance in the opening on the base metal layer by electroplating.

25. The magnetic sensor manufacturing method according to claim 23, wherein the magnetic substance is formed so that thickness of the magnetic substance be 1 µm or more and less than 15 µm.

26. The magnetic sensor manufacturing method according to claim 25, wherein the magnetic substance is formed so that thickness of the magnetic substance be in a range of 5 µm to 14 µm.

27. The magnetic sensor manufacturing method according to claim 23, wherein the step of forming the base layer and the step of forming the magnetic substance include the steps of: forming a first metal layer composed of Ti, W, or a TiW alloy, on the buffer coat layer; forming a second metal layer, containing Cu on the first metal layer; and forming a magnetic alloy layer having a magnetic amplification on the second metal layer.

28. The magnetic sensor manufacturing method according to claim 27, wherein the second metal layer is formed so that thickness is 0.1 to 2 µm.

29. The magnetic sensor manufacturing method according to claim 27, wherein the second metal layer is formed by sputtering or vacuum vapor deposition.

30. The magnetic sensor manufacturing method according to claim 27, wherein the magnetic alloy layer having the magnetic amplification is formed by electroplating on the second metal layer.

31. The magnetic sensor manufacturing method according to claim 27, wherein the step of forming the base layer and the step of forming the magnetic substance include the steps of: forming a first metal layer composed of Ti, W, or a TiW alloy on the buffer coat layer by sputtering or vacuum vapor deposition; forming a second metal layer composed of NiFe and having a thickness of 0.1 to 3 µm on the first metal layer by sputtering or vacuum vapor deposition; and forming a magnetic alloy film composed of NiFe on the second metal layer by electroplating.

32. The magnetic sensor manufacturing method according to claim 31, wherein thickness of the first metal layer is 0.01 to 1 µm.

33. The magnetic sensor manufacturing method according to claim 23, wherein the step of forming the base layer and the step of forming the magnetic substance include the steps of: forming a base metal layer for electroplating on the buffer coatlayer; forming a resist on the base metal layer by resist patterning so that an opening with a forward tapered shape is formed over the Hall elements; and forming the magnetic substance with the magnetic amplification in the opening above the base metal layer by electroplating so that a lower surface of the magnetic substance partially covers the region of each Hall element.

34. The magnetic sensor manufacturing method according to claim 33, wherein the magnetic substance is formed by photolithography so that an inner taper angle α between a surface of the semiconductor substrate and the side of the magnetic substance is an obtuse angle.

35. The magnetic sensor manufacturing method according to claim 34, wherein the taper angle α is $90° < α \leq 120°$.

36. The magnetic sensor manufacturing method according to claim 33, wherein the magnetic substance is formed by photolithography so that the inner taper angle α between the surface of the semiconductor substrate and the side of the magnetic substance is an acute angle.

* * * * *